(12) United States Patent
Bruhn, Jr. et al.

(10) Patent No.: US 11,641,195 B2
(45) Date of Patent: May 2, 2023

(54) SYSTEMS AND METHODS FOR CONTROLLING SWITCHING TIMING

(71) Applicant: Snap One, LLC, Salt Lake City, UT (US)

(72) Inventors: Robert Don Bruhn, Jr., West Jordan, UT (US); Timothy Paul Spens, Saratoga Springs, UT (US)

(*) Notice: Subject to any disclaimer, the term of this patent is extended or adjusted under 35 U.S.C. 154(b) by 385 days.

(21) Appl. No.: 15/419,779

(22) Filed: Jan. 30, 2017

(65) Prior Publication Data

US 2018/0217658 A1 Aug. 2, 2018

(51) Int. Cl.
*H03K 5/1536* (2006.01)
*G01R 19/165* (2006.01)

(52) U.S. Cl.
CPC ..... *H03K 5/1536* (2013.01); *G01R 19/16547* (2013.01); *Y02D 10/00* (2018.01)

(58) Field of Classification Search
None
See application file for complete search history.

(56) References Cited

U.S. PATENT DOCUMENTS

| | | | |
|---|---|---|---|
| 6,501,196 B1* | 12/2002 | Lo | H02J 3/006 307/125 |
| 9,279,835 B2 | 3/2016 | Russell et al. | |
| 2005/0216618 A1* | 9/2005 | Owens | G06F 11/24 710/60 |
| 2006/0279972 A1* | 12/2006 | Shao | H02M 3/33592 363/127 |
| 2008/0246414 A1* | 10/2008 | Xu | H05B 39/048 315/291 |
| 2014/0198419 A1* | 7/2014 | Kojovic | H02H 3/20 361/78 |
| 2014/0253102 A1* | 9/2014 | Wood | G01R 23/02 324/140 R |
| 2015/0249398 A1* | 9/2015 | Halberstadt | H02M 3/33592 363/21.14 |
| 2017/0292979 A1* | 10/2017 | Laird | G01R 19/16528 |
| 2017/0318633 A1* | 11/2017 | Zijlman | H05B 45/50 |

* cited by examiner

*Primary Examiner* — Paul Yen
(74) *Attorney, Agent, or Firm* — Quasim Shah

(57) ABSTRACT

An electronic device for controlling switching timing is described. The electronic device includes load voltage measuring circuitry configured to measure a load voltage to produce a load voltage measurement. The electronic device also includes a processor coupled to the load voltage measuring circuitry. The processor is configured to determine whether a load voltage spike is indicated by the load voltage measurement. The processor is configured to control switching timing based on whether a load voltage spike is indicated.

20 Claims, 21 Drawing Sheets

SYSTEMS AND METHODS FOR CONTROLLING SWITCHING TIMING

TECHNICAL FIELD

The present disclosure relates generally to electronic devices. More specifically, the present disclosure relates to systems and methods for controlling switching timing.

BACKGROUND

In recent years, the price of electronic devices has decreased dramatically. In addition, the size of electronic devices has continued to decrease. Further, electronic devices continue to increase in capability and convenience.

Decreasing prices and increasing capabilities of electronic devices has permitted modern devices to be conveniently used in homes and businesses. Many homes and businesses include multiple electronic devices to assist in everyday tasks. For example, electronic devices may be used for convenience and/or entertainment.

While some electronic devices may provide convenience and entertainment, many also require control. Moreover, these electronic devices consume electrical power. Some electronic devices may not be compatible with other devices and some electronic devices may not be easy to use. Safety is also a concern with some electronic devices. As can be observed from this discussion, improvements to electronic device ease of use and/or safety may be beneficial.

DETAILED DESCRIPTION

Figure 1:
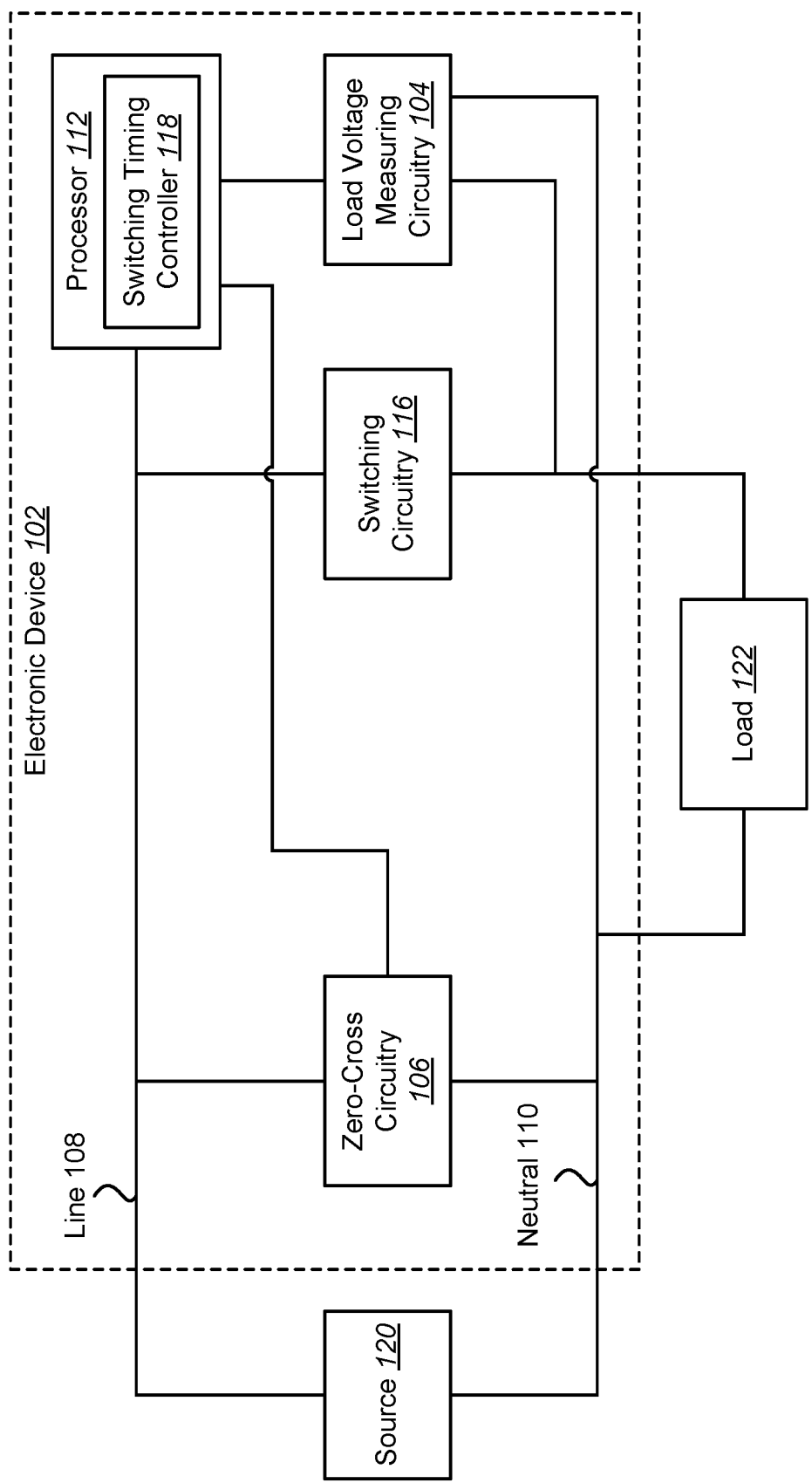
FIG. 1 is a block diagram illustrating one configuration of an electronic device for controlling switching timing.

An electronic device for controlling switching timing is described. The electronic device includes load voltage measuring circuitry configured to measure a load voltage to produce a load voltage measurement. The electronic device also includes a processor coupled to the load voltage measuring circuitry. The processor is configured to determine whether a load voltage spike is indicated by the load voltage measurement. The processor is configured to control switching timing based on whether a load voltage spike is indicated.

In a case that a load voltage spike is indicated, the processor may be configured to control the switching timing by determining whether to adjust the switching timing to an earlier timing or a later timing based on the load voltage spike. Determining whether to adjust the switching timing to an earlier timing or a later timing may include comparing a polarity of the load voltage spike to a previous swing polarity of the load voltage measurement. The processor may be configured to adjust the switching timing to the later timing in a case that the load voltage spike has a same polarity as the previous swing polarity, or may be configured to adjust the switching timing to the earlier timing in a case that the load voltage spike has a different polarity from the previous swing polarity.

The processor may be configured to control the switching timing by adjusting the switching timing in a case that a load voltage spike is indicated. The processor may be configured to repeatedly adjust the switching timing until a load voltage spike is not indicated.

The processor may be configured to control switching timing based on a load voltage spike caused by a dimming level change. The processor may be configured to control the switching timing based on a size of the voltage spike in a case that a voltage spike is indicated. The processor may be configured to control the switching timing by adjusting the switching timing by an amount of time relative to the size of the voltage spike.

The processor may be configured to control the switching timing using a closed-loop control algorithm. The processor may be configured to detect a load type and control the switching timing when the load type is an inductive load type.

A method for controlling switching timing by an electronic device is also described. The method includes measuring a load voltage to produce a load voltage measurement. The method also includes determining whether a load voltage spike is indicated by the load voltage measurement. The method further includes controlling switching timing based on whether a load voltage spike is indicated.

A non-transitory computer-readable medium for controlling switching timing is also described. The computer-readable medium includes executable instructions for determining whether a load voltage spike is indicated by a load voltage measurement. The computer-readable medium also includes instructions executable for controlling switching timing based on whether a load voltage spike is indicated.

Some configurations of the systems and methods disclosed herein may relate to controlling switching timing. For example, some configurations of the systems and methods disclosed herein may include measuring load voltage of a dimmer and using the voltage to change switching timing to correctly drive one or more load types (e.g., any load type).

Some electronic devices (e.g., phase cut dimmers) may change activation (e.g., "turn on") times and/or deactivation (e.g., "turn off") times based on the type of load attached. For example, some electronic devices (e.g., metal-oxide-semiconductor field-effect transistor (MOSFET) dimmers) may beneficially activate at an alternating current (AC) voltage zero cross and/or deactivate at a current zero cross for inductive loads (e.g., magnetic loads). Voltage zero cross is where a voltage (e.g., AC voltage) is at zero volts. Current zero cross is where the current is at zero amperes. For example, a voltage zero cross may occur at a transition from positive to negative voltage and at a transition from negative to positive voltage. Additionally or alternatively, a current zero cross may occur at a transition from positive to negative current and at a transition from negative to positive current.

Different load types may change the timing between voltage and current depending on whether the load type is inductive, resistive, or capacitive. If the deactivation and/or activation timing is late or early on inductive loads, large voltage and/or current spikes may occur, which may damage the electronic device (e.g., dimmer) and/or the load. For example, inductive loads referred to as MLV (Magnetic Low Voltage) loads may store energy. If MLV loads are deactivated early or late in relation to the current zero cross (ZX), a fly-back voltage may occur (which may be produced by the inductive load) that may damage the electronic device (e.g., dimmer) and/or load.

In some techniques, a current waveform may be compared to line voltage or zero cross waveforms to determine a voltage vs current offset at a 100% on level. One problem that may occur is that the current to voltage timing may vary depending on the dimming level of an inductive load. Thus, the dimmer may turn off and on at the correct current zero cross at some dimming levels, while at other dim levels, the timing may be off and thus may produce large voltage and/or current spikes that can damage the dimmer and/or load.

In some configurations of the systems and methods disclosed herein, a processor (e.g., central processing unit (CPU)) with a load voltage circuit may detect load voltage spikes and may use a closed loop control algorithm to adjust the activation and/or deactivation (e.g., turn on/off) timing accordingly to reduce (e.g., minimize) or eliminate the load voltage spikes. In some approaches, if the electronic device (e.g., dimmer) cannot get the voltage spikes under a threshold value, then the electronic device may indicate a fault state (e.g., show a fault state with LEDs) and/or may report the fault back to another device (e.g., control system, home automation system, etc.).

In some configurations, a load voltage circuit may be used with current measuring circuitry and/or line voltage measuring circuitry to determine a type of load attached to the electronic device (e.g., dimmer) and to adjust phase and timing accordingly. For driving inductive (e.g., magnetic) loads properly, the processor (e.g., CPU) may use the load voltage measurement circuitry signal with a closed loop control algorithm and may determine how to change the activation and/or deactivation (e.g., turn on/off) timing to reduce or eliminate voltage spikes. In some approaches, the algorithm may step the timing by a specified amount until the voltage spike is reduced below a set threshold level.

The load voltage measurement circuitry with the processor (e.g., CPU) may allow the electronic device (e.g., dimmer) to reduce and/or eliminate voltage spikes that can damage the electronic device and load, which may enable driving all load types properly. Some benefits of the systems and methods disclosed herein (e.g., the features enabled by the load voltage measuring circuitry) may include making an electronic device (e.g., dimmer) more robust with inductive loads and/or reducing protection circuitry. For example, some configurations of the systems and methods disclosed herein may reduce or eliminate the size of a metal-oxide varistor (MOV) and/or a transient-voltage-suppression (TVS) diode on the output. Additionally or alternatively, some configurations of the systems and methods disclosed herein may reduce size and/or voltage ratings of one or more load MOSFETs.

As used herein, the term "couple" and other variations thereof (e.g., "coupled," "coupling," etc.) may mean that one element is connected to another element directly or indirectly. For example, if a first element is coupled to a second element, the first element may be connected directly to the second element (without any intervening element, for example) or may be connected to the second element through one or more other elements. Lines in one or more of the Figures (e.g., in the block diagrams) may indicate couplings.

Various configurations are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the Figures, is not intended to limit scope, as claimed, but is merely representative of the systems and methods. As used herein, the term "plurality" may indicate two or more. For example, a plurality of components may refer to two or more components.

FIG. 1 is a block diagram illustrating one configuration of an electronic device 102 for controlling switching timing. The electronic device 102 may include load voltage measuring circuitry 104, a processor 112, switching circuitry 116, and/or zero-cross circuitry 106. The processor 112 may be coupled to the load voltage measuring circuitry 104, to the switching circuitry 116 and/or to the zero-cross circuitry 106.

Examples of electronic devices 102 include electronic circuits, integrated circuits, circuits with discrete components (e.g., resistors, capacitors, transistors, metal-oxide-semiconductor field-effect transistors (MOSFETs), etc.), computers, and/or devices that include one or more processors, memory cells, latches, logic gates, etc. For instance, the electronic device 102 may be a switch and/or dimmer that includes discrete components and a processor 112 (e.g., microprocessor) that may be used to control switching timing (and optionally to detect a load type, for example). The processor 112 may include and/or access software in memory and/or firmware. For example, the electronic device 102 may include memory. The memory may be included on-board the processor 112 or may be separate from the processor 112. The memory may store instructions and/or data (e.g., samples, voltage samples, and/or current samples, etc.). Additionally or alternatively, the memory or a separate memory may store firmware. In some configurations, the electronic device 102 may be a MOSFET-based dimmer (e.g., not a TRIAC-based dimmer). For example, the electronic device 102 may not include any TRIACs in some implementations. Additionally or alternatively, the electronic device 102 may be a phase-cut dimmer in some implementations. In some configurations, the electronic device 102 may be housed within a wall box.

The electronic device 102 may be coupled to a source 120 (e.g., an alternating current (AC) voltage source) and/or to a load 122. For example, the electronic device 102 may be coupled to the source 120 on a line 108 coupling (e.g., line 108 terminal) and a neutral 110 coupling (e.g., neutral 110 terminal). For example, an AC voltage may be provided to the electronic device 102 through the feed line 108. In some configurations, the source 120 may output an AC voltage (e.g., 240 volts (V), 120 V, etc.). The AC voltage may be provided to the electronic device 102 between the line 108 (e.g., "hot") and neutral 110. The voltage between the line 108 and neutral 110 may be referred to as line voltage.

The electronic device 102 may be coupled to a load 122. For example, the switching circuitry 116 of the electronic device 102 may be coupled to the load 122. The load 122 may also be coupled to the electronic device 102 at neutral 110 (e.g., a neutral line). The switching circuitry 116 may activate or deactivate the load 122. For example, the switching circuitry 116 state may determine whether the load 122 is activated (e.g., whether voltage is supplied to the load 122, whether the load 122 is "turned on," etc.). In some implementations, the switching circuitry 116 may include two switches (e.g., MOSFETs, MOSFETs with coupled drains, etc.).

Some load types may include inductive, capacitive, and resistive load types. Inductive load types may have a magnetic inductor of some sort. One example of an inductive load is a magnetic transformer for low voltage (e.g., magnetic low voltage (MLV)) lighting. Inductive load types may have a waveform characteristic in which the phase of the current lags (e.g., comes after) the voltage waveform. However, some inductive loads may have very little current lag. For example, some toroidal MLV loads may have power factors that are very close to 1 (where resistive loads may have a power factor of 1). Accordingly, it may be difficult to accurately distinguish some inductive loads from a resistive load using only current lag, for example. This may cause a device to incorrectly detect an inductive load as a resistive load and incorrectly drive the inductive load in reverse phase. Some configurations of the systems and methods disclosed herein may help to ameliorate this issue.

Capacitive load types may have a detectable amount of capacitance. Examples of capacitive loads are dimmable fluorescent lights and electronic low voltage (ELV) lighting. Capacitive load types may have a waveform characteristic in which the phase of the current leads (e.g., comes before) the voltage waveform. However, some capacitive loads may exhibit a different waveform characteristic due to a power supply. For example, some capacitive loads may have a waveform characteristic in which the phase of the current lags a voltage waveform (e.g., line voltage waveform) due to an activation delay resulting from a power supply. This may cause difficulty in correctly detecting load type. Some configurations of the systems and methods disclosed herein may help to ameliorate this issue.

Resistive load types may exhibit current and voltage waveforms in phase with each other. For example, there may be no significant (e.g., discernible) lead or lag between current and voltage in resistive load types. Examples of resistive loads include incandescent and halogen lights.

In some configurations, the electronic device 102 may be a dimmer and/or may include a dimmer. For example, the switching circuitry 116 may activate and/or deactivate the load 122 (periodically and/or cyclically, for instance) in order to achieve a particular dimming level. This may be referred to as "phase-cut" dimming, where different amounts (e.g., time segments, portions, etc.) of load voltage may be cut (e.g., deactivated) in order to produce different dimming levels. When no portion of the load voltage is cut, the load 122 may be driven in a fully activated state, where the full cycle of load voltage is provided. This may be referred to as a "full-on" (e.g., 100%) dimming level. A range of cycle portions may be cut according to dimming level. For example, a half (e.g., 50%) dimming level may cut approximately half of the load voltage cycle. Other dimming levels (e.g., 0%, 25%, 33%, 75%, 90%, etc.) may similarly be achieved by controlling the switching circuitry 116 to cut corresponding portions from the load voltage cycle.

As described above, one issue that may arise with dimmers is that current and/or voltage timing may vary based on the dimming level. For example, a change in dimming level may lead to a change in zero-cross timing (e.g., voltage and/or current zero-cross timings). If switching timing is not adapted to account for changes in zero-cross timing, voltage and/or current spikes may occur, which may damage the electronic device 102 and/or the load 122. Damage to the electronic device 102 may reduce the lifespan (e.g., lifetime) of the electronic device 102. Damage to the load 122 may reduce the lifespan (e.g., lifetime) of the load 122 and/or may lead to catastrophic failure of the load 122. Other electronic devices may have similar switching issues, where voltage and/or current spikes may damage the electronic devices. Some configurations of the systems and methods disclosed herein may control switching timing in order to reduce and/or eliminate voltage spikes and/or current spikes.

A load voltage may be a voltage between electronic device 102 lines for a load (e.g., between load couplings, between load terminals, between the switching circuitry 116 and neutral 110, etc.). The load voltage measuring circuitry 104 is configured to measure the load voltage to produce a load voltage measurement (e.g., a voltage waveform). For example, the load voltage measuring circuitry 104 may continuously capture the load voltage measurement (e.g., voltage waveform) by sampling the load voltage for one or more cycles of AC voltage (across the load 122, for instance). The measured load voltage and/or load voltage measurement may be provided to the processor 112. The load voltage measuring circuitry 104 may include discrete components (e.g., one or more resistors, capacitors, transistors, amplifiers, chip packages, etc.). In some configurations, the load voltage measuring circuitry 104 may only include discrete components.

In some configurations, the load voltage measuring circuitry 104 may capture a continuous time (e.g., analog) voltage waveform. The continuous time voltage waveform may represent how the load voltage varies over each cycle. In some configurations, the electronic device 102 may include and/or utilize an analog-to-digital converter (ADC) for capturing a discrete time (e.g., digital) voltage waveform of the load voltage by sampling the continuous time voltage waveform. For example, the ADC may sample at sufficient intervals to capture how the load voltage varies over one or more cycles. An example of a voltage waveform is described in more detail below in relation to FIG. 14. A digital voltage waveform may be one example of the load voltage measurement.

It should be noted that a load voltage measurement may be distinct from a line voltage measurement. For example, a load voltage measurement may indicate a load voltage across a load 122, while a line voltage measurement may indicate a line voltage across a source 120. In some configurations, the load voltage may be on a different side of the switching circuitry 116 than the line voltage. For example, the line voltage may be taken from the line 108 feed of the electronic device 102 (e.g., on the "front" side of the switching circuitry 116), while the load voltage may be taken from across the load 122 (e.g., on the "back" side of the switching circuitry 116). In some implementations of the systems and methods disclosed herein, no line voltage measurement (e.g., line voltage waveform) may be taken.

In some configurations, the electronic device 102 (e.g., load voltage measuring circuitry 104 and/or the processor 112) may determine one or more load voltage zero crossings. For example, the load voltage measuring circuitry 104 and/or the processor 112 may determine one or more times when the load voltage (e.g., load voltage measurement) crosses zero voltage. In some approaches, the load voltage measuring circuitry 104 and/or the processor 112 may determine the time when the load voltage is zero following a time when the load voltage is non-zero for a measurable duration. Additionally or alternatively, the load voltage measuring circuitry 104 and/or the processor 112 may determine a time when the load voltage crosses from a positive value to a negative value or crosses from a negative value to a positive value. Examples of voltage zero crossings are given in relation to FIG. 16.

In some implementations, the load voltage measuring circuitry 104 may determine and/or indicate one or more load voltage zero crossings to the processor 112. For example, the load voltage measuring circuitry 104 may send a signal (e.g., a step signal, a bit, a code, etc.) to the processor 112 that indicates the timing for the one or more load voltage zero crossings. Additionally or alternatively, the processor 112 may utilize the load voltage measurement (e.g., voltage waveform) to determine one or more load voltage zero crossings. One or more load voltage samples and/or load voltage zero crossings (e.g., load voltage zero cross timings, time stamps, etc.) may be stored in memory in some implementations.

The (optional) zero-cross circuitry 106 may detect a line voltage zero cross (e.g., one or more zero cross times for the line voltage). For example, the zero-cross circuitry 106 may determine the time (e.g., position) where the line voltage crosses a zero point. In other words, the zero-cross circuitry 106 may determine the time when the value of the line voltage is zero. The time when the value of the line voltage is zero may be the line voltage zero cross. In some approaches, the zero-cross circuitry 106 may detect at time at which the line voltage switches from negative to positive or positive to negative. For example, the line voltage zero cross may be determined (e.g., estimated) as a time between positive and negative voltage samples (e.g., between a last positive voltage sample and a first negative voltage sample in a cycle or between a last negative voltage sample and a first positive voltage sample). One or more line voltage zero crossings (e.g., line voltage zero cross timings, time stamps, etc.) may be stored in memory in some implementations. Line voltage zero crossings may be utilized for detecting load type in some configurations of the systems and methods disclosed herein.

The processor 112 may direct the operation of the electronic device 102. In some configurations, the processor 112 may include a processor and instructions in memory (e.g., software, firmware, or both) for controlling the electronic device 102. In some configurations, the processor 112 may include and/or implement a switching timing controller 118. The processor 112 (e.g., switching timing controller 118) may determine whether a load voltage spike is indicated by the load voltage measurement. In some cases, for example, a load voltage spike may have a higher peak value than a crest peak value of the load voltage measurement.

In some approaches, the switching timing controller 118 may determine whether a load voltage spike is indicated based on a spike threshold. For example, if the load voltage measurement exceeds the spike threshold, then the switching timing controller 118 may determine that the load voltage spike is indicated. In some configurations, the spike threshold may be predetermined and/or static. For example, the spike threshold may be set at a particular voltage. For instance, the spike threshold may be 50 V. It should be noted that the spike threshold value may be selected, set, and/or dependent on line voltage (e.g., 120 V, 230 V, etc.) in some configurations. Accordingly, different spike thresholds may be utilized for different configurations of the systems and methods disclosed herein. In some approaches, the spike threshold may be applied to a particular time segment of the load voltage measurement. For example, a time segment of the load voltage measurement corresponding to a period after a switch deactivation may be compared to the spike threshold. In some configurations, the time segment of the load voltage measurement may be based on the line voltage zero cross. For example, the time segment may be a range before and/or after the line voltage zero cross. It should be noted that the time segment range may vary depending on frequency. In a case that the spike threshold is exceeded, the switching timing controller 118 may determine that a voltage spike is indicated. For example, if the spike threshold is exceeded, the processor 112 may adjust switching timing (e.g., control the switching circuitry 116 to switch with a different timing). If the spike threshold is not exceeded (e.g., the load voltage threshold is less than or equal to the spike threshold), the switching timing controller 118 may determine that voltage spike is not indicated. For example, if the spike threshold is not exceeded, the switching timing controller 118 may maintain switching timing (e.g., may not adjust switching timing).

It should be noted that one or more spike thresholds may be utilized. For example, a positive spike threshold and a negative spike threshold may be utilized. For instance, the switching timing controller 118 may determine whether the load voltage measurement exceeds (e.g., is greater than) the positive spike threshold or whether the load voltage measurement exceeds (e.g., is less than or is greater in magnitude than) the negative spike threshold. A voltage spike may be indicated if the positive spike threshold or the negative spike threshold is exceeded. One or more voltage spike thresholds may be stored in memory in some implementations.

In some configurations, the spike threshold may be based on a line voltage. For example, the spike threshold may be relative to the line voltage. In some approaches, a spike threshold may be the line voltage. In other approaches, a spike threshold may be an amount below line voltage or above line voltage. For example, the electronic device 102 may include line voltage measuring circuitry in some configurations. The processor 112 (e.g., switching timing controller 118) may calculate the spike threshold based on a line voltage measurement produced by the line voltage measuring circuitry. For instance, the spike threshold(s) may be an amount (in voltage) above the line voltage measurement (and/or an amount below the line voltage measurement). Accordingly, the spike threshold(s) may be calculated relative to the line voltage measurement and may be compared to the load voltage measurement. Examples of approaches for load detection involving line voltage are given in relation to FIG. 9. One or more line voltage samples and/or line voltage zero crossings may be stored in memory in some implementations.

The processor 112 (e.g., switching timing controller 118) may control switching timing based on whether a load voltage spike is indicated. For example, the switching timing controller 118 may adjust switching timing in a case that a load voltage spike is indicated. If a load voltage spike is not indicated, the switching timing controller 118 may maintain (e.g., not adjust) switching timing.

In some configurations, the processor 112 (e.g., switching timing controller 118) may control the switching timing by determining whether to adjust the switching timing to an earlier timing or a later timing based on the load voltage spike (in a case that a load voltage spike is indicated, for instance). For example, the switching timing controller 118 may determine whether the load voltage spike indicates whether the switching timing is late or early. Switching timing may be late if it is after a designated switch point (e.g., after a current zero cross, after a voltage zero cross, and/or after a switch point that avoids a voltage and/or current spike, etc.). Switching timing may be early if it is before a designated switch point (e.g., before a current zero cross, before a voltage zero cross, and/or before a switch point that avoids a voltage and/or current spike, etc.).

The processor 112 (e.g., switching timing controller 118) may determine whether switching timing is late (e.g., was late for one or more previous switching instances) based on the load voltage spike (e.g., one or more load voltage spike characteristics). The processor 112 (e.g., switching timing controller 118) may determine whether to adjust the switching timing to an earlier timing or a later timing based on the load voltage spike. For example, if the load voltage spike indicates that switching timing is early, the switching timing controller 118 may determine to adjust the switching timing to a later timing. If the load voltage spike indicates that switching timing is late, the switching timing controller 118 may determine to adjust the switching timing to an earlier timing.

An earlier timing or a later timing may be relative to a subsequent swing or cycle. For example, switching timing may be determined relative to a cycle and/or swing length. For instance, switching timing may be or indicate switching points at regularly occurring intervals (e.g., periods, wavelengths, half periods, half wavelengths, swing widths, etc.). Adjusting switching timing to an earlier timing may include shifting a switching point of a subsequent cycle or swing to occur sooner than the most recent switching point plus a cycle period or swing width. For example, the adjusted switching point may be the time of the most recent switching point plus a cycle period (or swing width) minus a time step for earlier switching timing. Adjusting switching timing to a later timing may include shifting a switching point of a subsequent cycle or swing to occur later than the most recent switching point plus a cycle period or swing width. For example, the adjusted switching point may be the time of the most recent switching point plus a cycle period (or swing width) plus a time step for later switching timing. The amount of time or the time step may be on an order of microseconds or milliseconds, etc., based on AC frequency of the source (e.g., line voltage or load voltage).

In some approaches, the polarity of the load voltage spike (e.g., whether the load voltage spike is positive or negative) may indicate whether switching timing is early or late. For example, the processor 112 (e.g., switching timing controller 118) may compare a polarity of the load voltage spike to a previous swing polarity of the load voltage measurement. The previous swing polarity of the load voltage measurement may indicate the polarity of the last load voltage measurement swing (e.g., crest or trough, maximum or minimum, etc.) before switching. In some approaches, the previous swing polarity may be measured at a set amount of time before switching and/or before the load voltage spike. For example, the switching timing controller 118 may measure the previous swing polarity of the last voltage swing as the voltage approaches zero cross (e.g., between the last voltage crest or trough and zero cross). In some approaches, the processor 112 (e.g., switching timing controller 118) may determine the previous swing polarity from a sample of the load voltage measurement that is a set amount of time (e.g., an amount of microseconds, a number of samples, etc.) before switching or before the load voltage spike. In some approaches, the processor 112 may determine the previous swing polarity from an average of a number of samples before switching or before the load voltage spike. In some approaches, a previous swing polarity of a line voltage measurement may be additionally or alternatively utilized. If the load voltage spike polarity is the same as the previous swing polarity (of the load voltage measurement and/or line voltage measurement, for example), switching timing may be early. If the load voltage spike polarity is different from the previous swing polarity (of the load voltage measurement and/or line voltage measurement, for example), switching timing may be late.

In some approaches, the processor 112 (e.g., switching timing controller 118) may determine switching timing based on spike ringing. For example, if the spike is followed by a number of ringing oscillations (e.g., two or three, etc.), the switching timing controller 118 may determine that switching timing is early. If the spike is not followed by significant ringing, the switching timing controller 118 may determine that switching timing is late.

The processor 112 (e.g., switching timing controller 118) may adjust switching timing (for one or more subsequent switching instances, for example) in order to compensate for early or late switching timing. For example, if switching timing is determined to be early, the switching timing controller 118 may adjust the switching timing to a later timing. If switching timing is determined to be late, the switching timing controller 118 may adjust the switching timing to an earlier timing. In some configurations, the processor 112 (e.g., switching timing controller 118) may adjust the switching timing to a later timing in a case that the load voltage spike has a same polarity as the previous swing polarity or may adjust the switching timing to an earlier timing in a case that the load voltage spike has a different polarity from the previous swing polarity.

Adjusting the switching timing (to an earlier timing or to a later timing, for example) may include shifting the switching timing by an amount of time (e.g., a time step) for one or more subsequent switching cycles or swings. For example, if switching timing is late (as indicated by the load voltage spike), the switching timing controller 118 may shift switching timing for a subsequent switching cycle or swing by a time step earlier. If switching timing is early (as indicated by the load voltage spike), the switching timing controller 118 may shift switching timing for a subsequent switching cycle or swing by a time step later.

The amount of time (e.g., time step) for switching adjustment may be a fixed amount or an adaptive amount. For example, the amount of time may be a fixed amount of microseconds. In other approaches, the amount of time may be adaptive. For instance, the amount of time may be determined based on a function of the size (e.g., magnitude) of the voltage spike. The larger the voltage spike, the larger the amount of time (e.g., time step) may be.

In some configurations, load voltage measurement and switching timing adjustment may be performed repeatedly until a voltage spike is not indicated. For example, if a voltage spike is indicated corresponding to a first switching point, cycle, or swing, the switching timing controller 118 may adjust the switching timing. Then, the load voltage may be measured again. If a voltage spike is indicated again, the switching timing controller 118 may again adjust the switching timing. These procedures may be repeated until the voltage spiking is brought under a threshold (e.g., spike threshold). Accordingly, the electronic device 102 (e.g., processor 112, switching timing controller 118, etc.) may control the switching timing using a closed-loop control algorithm. The control algorithm may be closed-loop because feedback (e.g., a load voltage measurement, voltage spike detection, etc.) is utilized to control the switching timing.

If adjusting the timing fails to reduce the voltage spiking under the threshold (after a threshold number of adjustments, for example), the electronic device 102 (e.g., processor 112, switching timing controller 118, etc.) may indicate a fault in some configurations. For example, the electronic device 102 may activate a light indicating the fault, may turn a status light to a particular color (e.g., red), and/or may send a fault message to another device (e.g., to a control system, home automation system, etc.). Additionally or alternatively, the electronic device 102 may deactivate the load 122 (e.g., switch off the load completely). Or, the electronic device 102 may activate the load 122 with a "full on" setting (e.g., without phase cutting). One or more of these procedures may protect the electronic device 102 and/or the load 122 from voltage and/or current spikes in a scenario where the spiking cannot be controlled by adjusting switching timing.

In some configurations, switching timing for positive swings and negative swings may be performed jointly. For example, the electronic device 102 may adjust switching timing for both positive and negative swings (by a same amount, for instance) based on a load voltage spike on either polarity. This may provide a simple approach with an immediate response for the next swing.

In some configurations, switching timing for positive swings and negative swings may be performed independently. For example, the electronic device 102 may control switching timing for positive swings independently from switching timing for negative swings. For instance, the electronic device 102 may adjust switching timing for positive swings based on load voltage spikes corresponding to (e.g., near the end of) positive swings. Also, the electronic device 102 may adjust switching timing for negative swings based on load voltage spikes corresponding to (e.g., near the end of) negative swings. This may provide a flexible approach that allows for voltage waveform asymmetries.

In some implementations, switching timing control may be performed after an initialization (e.g., "boot-up," load type detection, etc.) of the electronic device 102. For example, the electronic device 102 may perform one or more initialization procedures when the source 120 first supplies power to the electronic device 102 (e.g., when the electronic device 102 is initially coupled to the source 120, when the source 120 is initially supplied (or re-supplied), etc.). For instance, the electronic device 102 may perform one or more initialization procedures when a breaker switch is closed to supply power to the electronic device 102. Additionally or alternatively, the electronic device 102 may perform one or more initialization procedures upon restoration of power (e.g., when power is restored after a power outage, etc.). In some implementations, the initialization procedures may include determining an initial switching timing. Switching timing control may be performed after the initialization phase (in an operation phase, a steady-state phase, etc., for example) to adjust the switching timing as indicated by one or more detected voltage spikes. In some implementations, load type detection may be performed during the initialization phase as an initialization procedure. In some approaches, switching timing control may be performed only in a case that the load 122 is detected as an inductive load type. In other approaches, switching timing control may be performed regardless of detected load type (or regardless of whether load type detection is performed at all). Some approaches to load type detection are described as follows.

The electronic device 102 (e.g., processor 112 and/or switching circuitry 116) may control the amount of power delivered to the load 122. In some configurations (e.g., switch, dimmer, etc.), the switching circuitry 116 may turn on (e.g., activate) the power or turn off (e.g., deactivate) the power to the load 122. Additionally or alternatively, the electronic device 102 (e.g., processor 112 and/or switching circuitry 116) may adjust the amount of power that is delivered to the load 122 (e.g., enable, disable, adjust duty cycle, cut phase, increase phase, etc.). Examples of the switching circuitry 116 may include one or more switches (e.g., mechanical relay, solid state relay, MOSFETs, transistors, etc.). The switching circuitry 116 may include discrete components. In some configurations, the switching circuitry 116 may only include discrete components.

In some configurations, the electronic device 102 may be housed in a wall box. For example, the electronic device 102 may be configured to be contained within a wall box as an electrical device. A wall box (e.g., electrical box, outlet box, switch box, pattress, etc.) is the container for the body of an electrical device (e.g., light switch, power outlet, dimmer, etc.). While housed in the wall box, the face of the electrical device may be approximately flush with a wall. In general, the width of a wall box may be measured in "gangs," which indicates the number of electrical devices (e.g., light switches, power outlets, dimmers, etc.) that the wall box can hold. For example, a single-gang wall box may hold a single electrical device and a double-gang wall box may hold two electrical devices (side by side, for example). The depth of a wall box may be standard depth, shallow depth, or deep depth. In some configurations of the systems and methods disclosed herein, a wall box may be a single-gang standard depth wall box and a wall box device may be an electronic device 102 that may be held in a single-gang standard depth wall box. In one configuration, a European style wall box having a width of 86 millimeters, a height of 86 millimeters and a depth of 35 millimeters may be used. In another configuration, a United States style, single-gang, standard depth wall box may be used. It should be noted that other configurations of the systems and methods disclosed herein may not be housed in a wall box. For example, some configurations of the systems and methods disclosed herein may be implemented in lighting devices that are not housed in wall boxes. Additionally or alternatively, a spacer may be utilized in some configurations that places a portion of the device (e.g., an electronic device 102) outside of a wall box.

A wall box switch may be one example of an electronic device 102 with two discrete states that may be used to control a load 122. A wall box switch may be in an "off" state or in an "on" state. Thus, a wall box switch may turn on or off electrical power to the load 122. In one configuration, a wall box switch may use a relay (e.g., mechanical, solid state, etc.) to turn on or off electrical power to the load 122. A simple example of a wall box switch is a light switch that turns on or off electrical power to a light. The light switch may turn on the light by turning on electrical power to the light or turn off the light by turning off electrical power to the light.

A wall box dimmer is another example of an electronic device 102 with variable states that may be used to control a load 122. A wall box dimmer may variably adjust the amount of electrical power that is driven to the load 122 (e.g., by adjusting the root mean square (RMS) voltage, adjusting pulse-width modulation, adjusting duty cycle, adjusting a phase cut, etc.). For example, a wall box dimmer may provide 0% electrical power, 100% electrical power or some percentage in between. In one configuration, a wall box dimmer may use one or more semiconductors (e.g., MOSFETs, transistors, etc.) to control the load. A simple example of a wall box dimmer is a light dimmer that may turn on or off and variably control the brightness of a light. For example, the light dimmer may increase the brightness of the light by increasing the amount of electrical power driven to the light. Similarly, the light dimmer may decrease the brightness of the light by decreasing the amount of electrical power driven to the light. In some configurations, the wall box device may include switching and dimming capabilities.

It should be noted that one or more of the elements or components described in relation to FIG. 1 may be combined and/or divided in some configurations. For example, the zero-cross circuitry 106, switching circuitry 116, processor 112, and/or load voltage measuring circuitry 104 may be divided into smaller elements or components that perform a subset of the functions described herein. Additionally or alternatively, one or more of the zero-cross circuitry 106, switching circuitry 116, processor 112, and/or load voltage measuring circuitry 104 may be combined.

Figure 2:
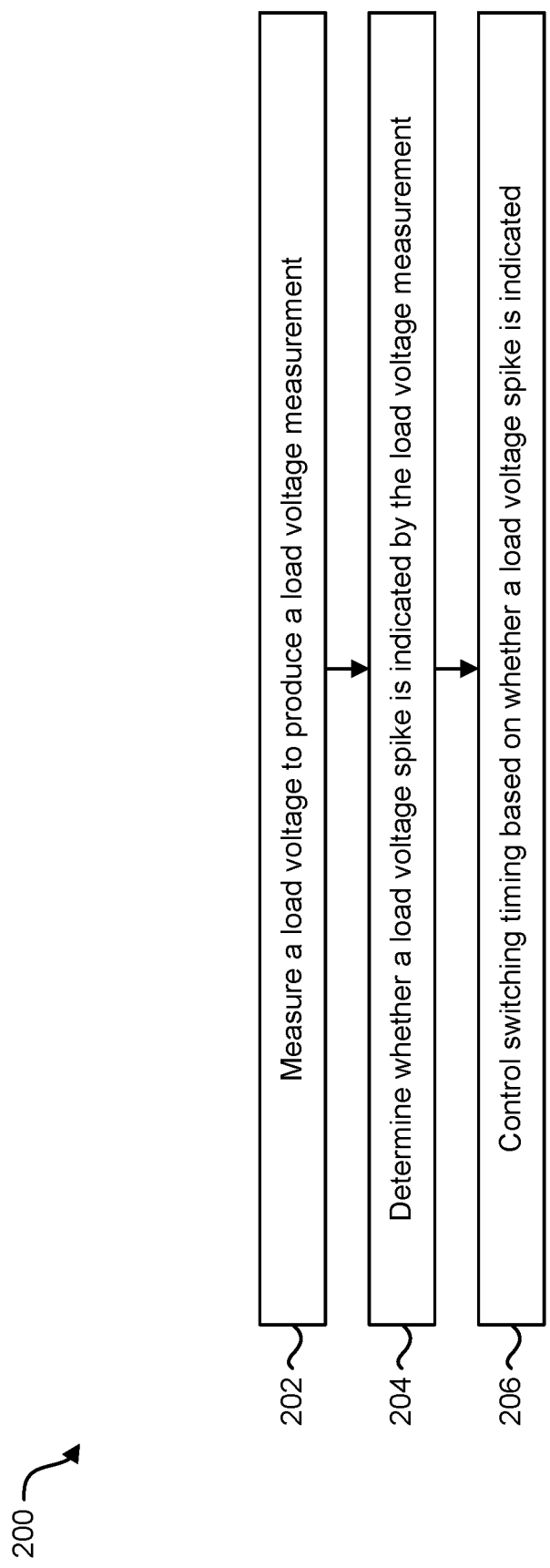
FIG. 2 is a flow diagram illustrating one configuration of a method for controlling switching timing.

FIG. 2 is a flow diagram illustrating one configuration of a method 200 for controlling switching timing. The method 200 may be performed by the electronic device 102 described in relation to FIG. 1. The electronic device 102 may measure 202 a load voltage to produce a load voltage measurement. This may be accomplished as described in relation to FIG. 1. For example, the electronic device 102 (e.g., load voltage measuring circuitry 104) may measure 202 the load voltage as a load voltage measurement (e.g., a voltage waveform, a series of voltage data samples, etc.). The load voltage measurement may indicate the load voltage (e.g., voltage across a load 122) for one or more cycles (e.g., AC voltage cycles).

The electronic device 102 may determine 204 whether a load voltage spike is indicated by the load voltage measurement. This may be accomplished as described in relation to FIG. 1. For example, the electronic device 102 (e.g., processor 112) may determine whether a load voltage spike is indicated by the load voltage measurement. A load voltage spike may be indicated in a case that the load voltage measurement exceeds a spike threshold (e.g., a predetermined spike threshold or a spike threshold determined based on measuring a line voltage). For example, the presence of a load voltage spike may indicate that switching timing is off from a designated switch point (e.g., a desired switch point, a switch point that avoids causing voltage spiking, etc.).

The electronic device 102 may control 206 switching timing based on whether a load voltage spike is indicated. This may be accomplished as described in relation to FIG. 1. For example, the electronic device 102 may adjust switching timing in a case a load voltage spike is indicated. For instance, if the load voltage spike indicates early switching timing, the electronic device 102 may adjust the switching timing to a later switching timing. If the load voltage spike indicates late switching timing, the electronic device 102 may adjust the switching timing to an earlier switching timing. In some approaches, the electronic device 102 may maintain switching timing in a case that no load voltage spike is indicated.

Figure 3:
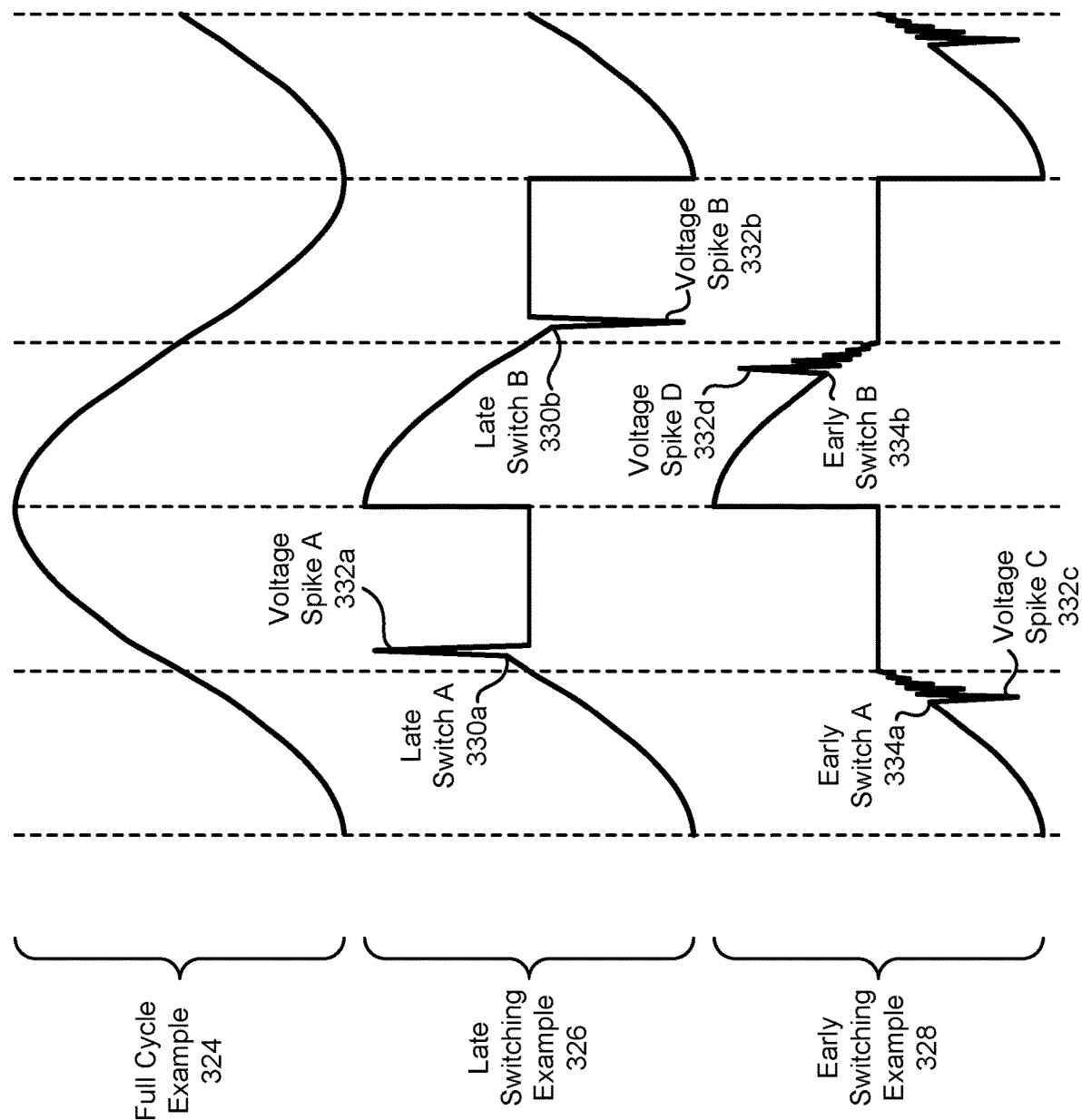
FIG. 3 is a diagram illustrating examples of voltage waveforms.

FIG. 3 is a diagram illustrating examples of voltage waveforms. In particular, FIG. 3 illustrates a full cycle example 324, a late switching example 326, and an early switching example 328. The full cycle example 324 illustrates an example of a load voltage waveform (e.g., load voltage measurement) where the entire waveform is uncut by switching.

The late switching example 326 illustrates an example of a load voltage waveform (e.g., load voltage measurement) where the load voltage is switched in forward phase with a phase cut of approximately 50%. As illustrated in the late switching example 326, approximately 50% of the upward voltage swing is cut and approximately 50% of the downward voltage swing is cut. The late switching example 326 also illustrates late switch A 330a and late switch B 330b. In a case where late switching occurs (for an inductive load, for example), a voltage spike may occur. Accordingly, a voltage spike may indicate a late switch. As described herein, a spike may be detected if the load voltage measurement crosses a spike threshold. In the late switching example 326, voltage spike A 332a occurs as a result of late switch A 330a. Additionally, voltage spike B 332b occurs as a result of late switch B 330b. As illustrated in the late switching example 326, voltage spike A 332a has an opposite polarity from the previous swing polarity (e.g., the trough). Additionally, voltage spike B 332b has an opposite polarity from the previous swing polarity (e.g., the crest). Additionally or alternatively, voltage spike A 332a and voltage spike B 332b exhibit little or no ringing oscillations after spiking. In accordance with some configurations of the systems and methods disclosed herein, the electronic device 102 may detect a voltage spike, which may indicate a switching timing error. The electronic device 102 may utilize the voltage spike detection and one or more characteristics of the voltage spike (e.g., opposite polarity from a previous voltage swing and/or no substantial ringing oscillations) to determine to adjust switching timing to an earlier switching timing. Adjusting to an earlier switching timing may reduce and/or eliminate further voltage spiking.

The early switching example 328 illustrates an example of a load voltage waveform (e.g., load voltage measurement) where the load voltage is switched in forward phase with a phase cut of approximately 50%. As illustrated in the early switching example 328, approximately 50% of the upward voltage swing is cut and approximately 50% of the downward voltage swing is cut. The early switching example 328 also illustrates early switch A 334a and early switch B 334b. In a case where early switching occurs (for an inductive load, for example), a voltage spike may occur. Accordingly, a voltage spike may indicate an early switch. As described herein, a spike may be detected if the load voltage measurement crosses a spike threshold. In the early switching example 328, voltage spike C 332c occurs as a result of early switch A 334a. Additionally, voltage spike D 332d occurs as a result of early switch B 334b. As illustrated in the early switching example 328, voltage spike C 332c has the same polarity as the previous swing polarity (e.g., the trough). Additionally, voltage spike D 332d has the same polarity as the previous swing polarity (e.g., the crest). Additionally or alternatively, voltage spike C 332c and voltage spike D 332d exhibit ringing oscillations after spiking. In accordance with some configurations of the systems and methods disclosed herein, the electronic device 102 may detect a voltage spike, which may indicate a switching timing error. The electronic device 102 may utilize the voltage spike detection and one or more characteristics of the voltage spike (e.g., the same polarity as a previous voltage swing and/or ringing oscillations) to determine to adjust switching timing to a later switching timing. Adjusting to a later switching timing may reduce and/or eliminate further voltage spiking.

Figure 4:
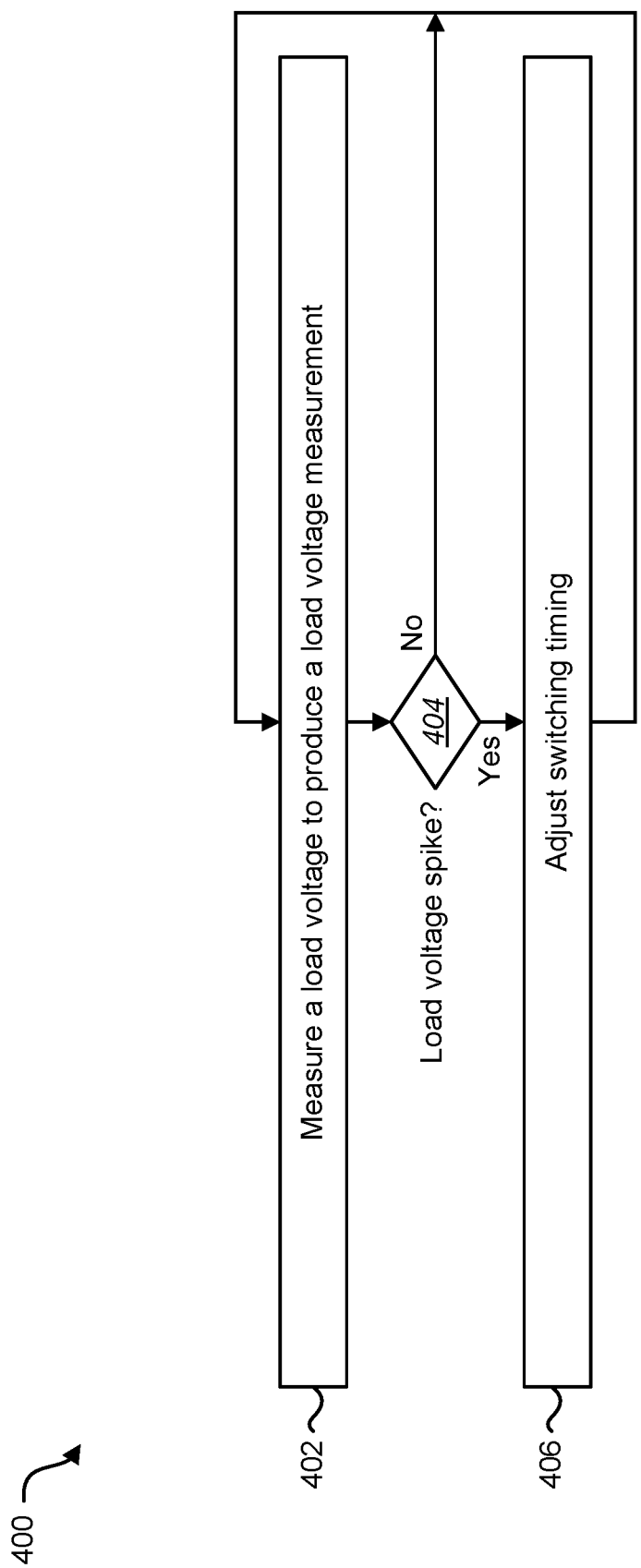
FIG. 4 is a flow diagram illustrating a more specific configuration of a method for controlling switching timing.

FIG. 4 is a flow diagram illustrating a more specific configuration of a method 400 for controlling switching timing. The method 400 may be performed by the electronic device 102 described in relation to FIG. 1. The electronic device 102 may measure 402 a load voltage to produce a load voltage measurement. This may be accomplished as described in relation to one or more of FIGS. 1-2.

The electronic device 102 may determine 404 whether a load voltage spike is indicated by the load voltage measurement. This may be accomplished as described in relation to one or more of FIGS. 1-3. For example, a load voltage spike may be indicated in a case that the load voltage measurement exceeds a spike threshold (e.g., a predetermined spike threshold or a spike threshold determined based on measuring a line voltage). If a load voltage spike is not indicated, switching timing may be maintained and load voltage measuring 402 may continue (for another time period, one or more swings, one or more switches, one or more cycles, etc., for example).

If a load voltage spike is indicated, the electronic device 102 may adjust 406 switching timing. This may be accomplished as described in relation to one or more of FIGS. 1-3. For example, if the load voltage spike indicates early switching timing, the electronic device 102 may adjust 406 the switching timing to a later switching timing. If the load voltage spike indicates late switching timing, the electronic device 102 may adjust 406 the switching timing to an earlier switching timing. The electronic device 102 may continue to measure 402 a load voltage (for another time period, one or more swings, one or more switches, one or more cycles, etc., for example). As illustrated by the method 400, the electronic device 102 may control the switching timing by adjusting the switching timing in a case that a voltage spike is indicated. The electronic device 102 may repeatedly adjust the switching timing until a load voltage spike is not indicated. For example, the electronic device 102 may adjust 406 switching timing each time a load voltage spike is indicated.

In some configurations, the switching timing may be adjusted until a load voltage spike is not indicated, unless a load voltage spike continues to occur after a threshold number of switching timing adjustments. In this case, the electronic device 102 may indicate a fault. Additionally or alternatively, the electronic device 102 may deactivate a load. Or, the electronic device 102 may activate the load in a "full on" state. One or more of these procedures may protect the electronic device 102 and/or the load.

Figure 5:
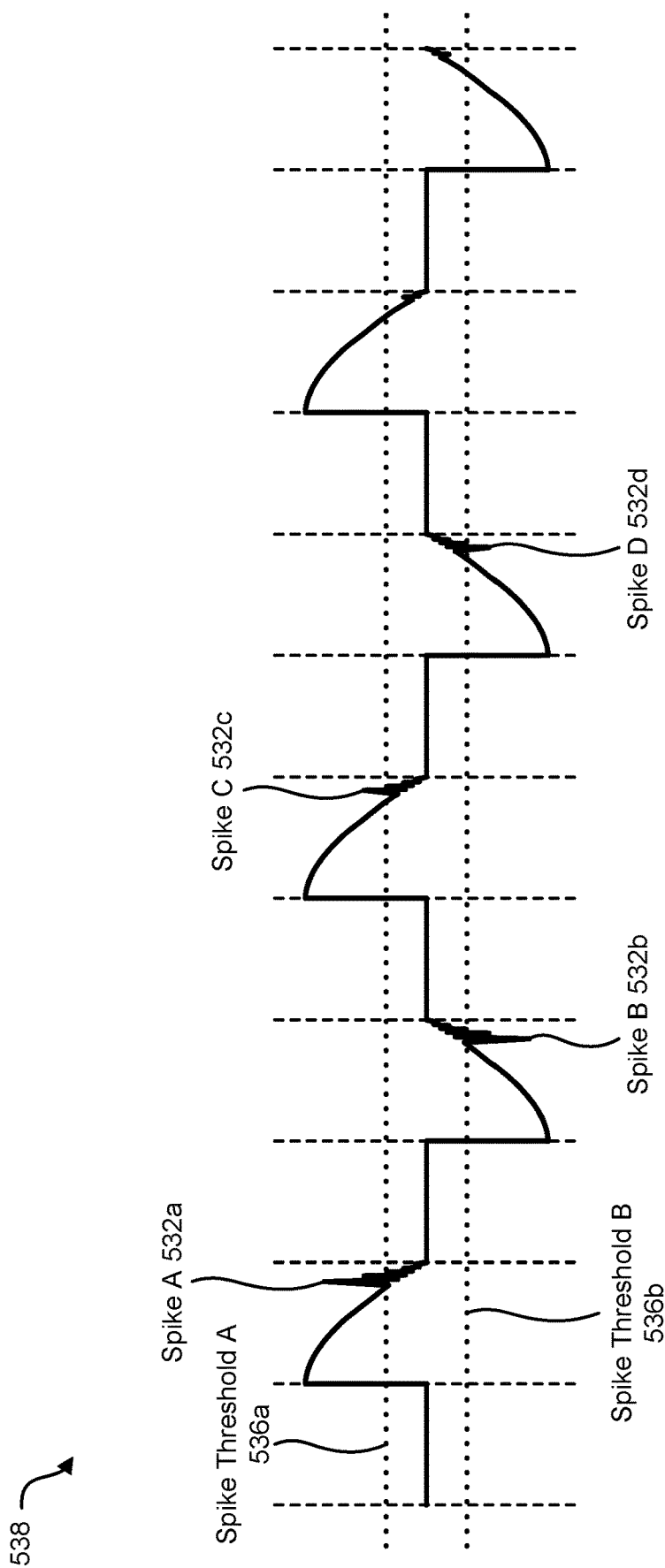
FIG. 5 is a diagram illustrating an example of load voltage over several cycles.

FIG. 5 is a diagram illustrating an example 538 of load voltage (e.g., load voltage measurement, a load voltage waveform, etc.) over several cycles. In this example 538, spike threshold A 536a and spike threshold B 536b are also illustrated. As illustrated in FIG. 5, spike A 532a occurs after a positive voltage swing. The electronic device 102 may detect spike A 532a, because spike A 532a exceeds spike threshold A 536a after switching. Also, spike B 532b occurs after a negative voltage swing. The electronic device 102 may detect spike B 532b, because spike B 532b exceeds spike threshold B 536b after switching.

As described herein, the electronic device 102 may determine that spike A 532a indicates early switching because spike A 532a has the same positive polarity as the previous positive swing polarity (and/or because ringing oscillations occur after switching, for example). Additionally or alternatively, the electronic device 102 may determine that spike B 532b indicates early switching because spike B 532b has the same negative polarity as the previous negative swing polarity (and/or because ringing oscillations occur after switching, for example).

In response to spike A 532a and/or spike B 532b, the electronic device 102 may adjust switching timing to a later switching timing. For example, the electronic device 102 may perform switching at a later time (relative to the next cycle, for instance). As illustrated in FIG. 5, the switching timing adjustment may reduce spiking, resulting in spike C 532c and/or spike D 532d. Because spike C 532c exceeds spike threshold A 536a and/or spike D 532d exceeds spike threshold B 536b, the electronic device 102 may adjust switching timing again to a later switching timing. This may result in reducing and/or eliminating voltage spiking as illustrated in FIG. 5.

Figure 6:
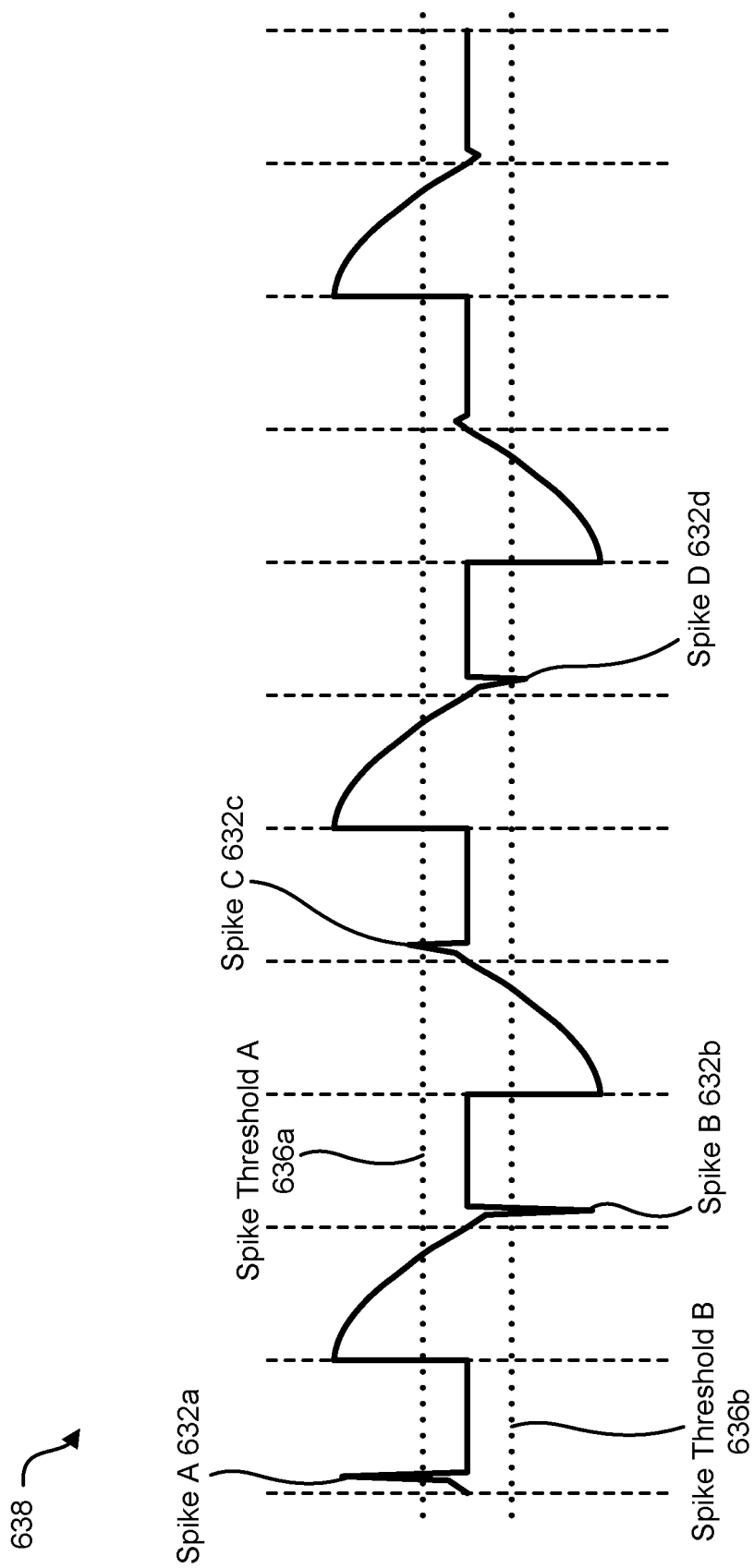
FIG. 6 is a diagram illustrating another example of load voltage over several cycles.

FIG. 6 is a diagram illustrating another example 638 of load voltage (e.g., load voltage measurement, a load voltage waveform, etc.) over several cycles. In this example 638, spike threshold A 636a and spike threshold B 636b are also illustrated. As illustrated in FIG. 6, spike A 632a occurs after a negative voltage swing. The electronic device 102 may detect spike A 632a, because spike A 632a exceeds spike threshold A 636a after switching. Also, spike B 632b occurs after a positive voltage swing. The electronic device 102 may detect spike B 632b, because spike B 632b exceeds spike threshold B 636b after switching.

As described herein, the electronic device 102 may determine that spike A 632a indicates late switching because spike A 632a has a different (positive) polarity from the previous (negative) swing polarity (and/or because ringing oscillations do not occur after switching, for example). Additionally or alternatively, the electronic device 102 may determine that spike B 632b indicates late switching because spike B 632b has a different (negative) from the previous (positive) swing polarity (and/or because ringing oscillations do not occur after switching, for example).

In response to spike A 632a and/or spike B 632b, the electronic device 102 may adjust switching timing to an earlier switching timing. For example, the electronic device 102 may perform switching at an earlier time (relative to the next cycle, for instance). As illustrated in FIG. 6, the switching timing adjustment may reduce spiking, resulting in spike C 632c and/or spike D 632d. Because spike C 632c exceeds spike threshold A 636a and/or spike D 632d exceeds spike threshold B 636b, the electronic device 102 may adjust switching timing again to an earlier switching timing. This may result in reducing and/or eliminating voltage spiking as illustrated in FIG. 6.

Figure 7:
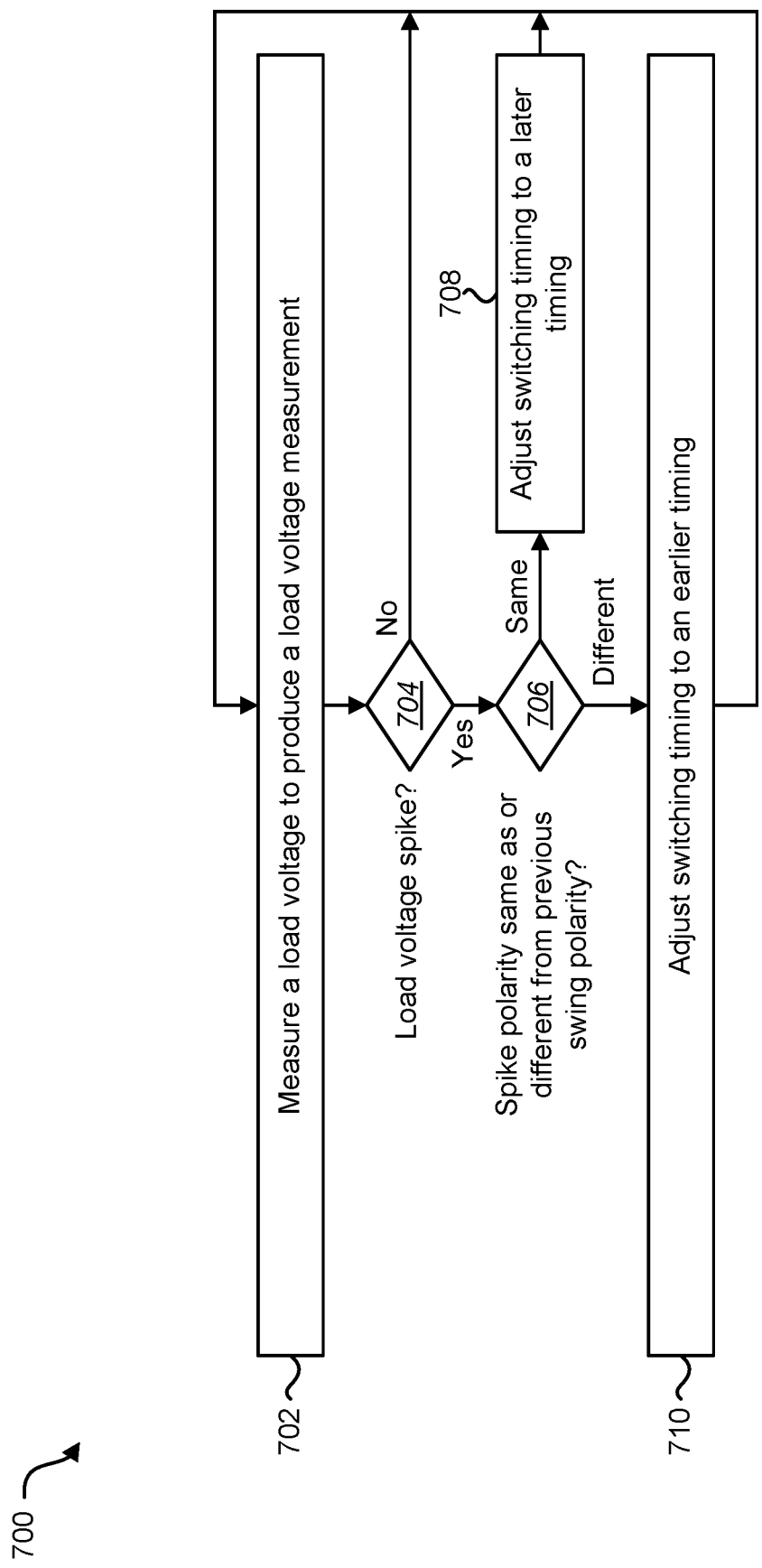
FIG. 7 is a flow diagram illustrating another more specific configuration of a method for controlling switching timing.

FIG. 7 is a flow diagram illustrating another more specific configuration of a method 700 for controlling switching timing. The method 700 may be performed by the electronic device 102 described in relation to FIG. 1. The electronic device 102 may measure 702 a load voltage to produce a load voltage measurement. This may be accomplished as described in relation to one or more of FIGS. 1-2 and 4.

The electronic device 102 may determine 704 whether a load voltage spike is indicated by the load voltage measurement. This may be accomplished as described in relation to one or more of FIGS. 1-6. For example, a load voltage spike may be indicated in a case that the load voltage measurement exceeds a spike threshold (e.g., a predetermined spike threshold or a spike threshold determined based on measuring a line voltage). If a load voltage spike is not indicated, switching timing may be maintained and load voltage measuring 702 may continue (for another time period, one or more swings, one or more switches, one or more cycles, etc., for example).

If a load voltage spike is indicated, the electronic device 102 may determine 706 whether the spike polarity is the same as or different from a previous swing polarity. This may be accomplished as described in relation to one or more of FIGS. 1,3, and 5-6. For example, the electronic device 102 may compare a polarity of the load voltage spike (e.g., positive or negative) to a previous swing polarity of the load voltage measurement (e.g., a polarity from the previous voltage swing). In some approaches, the electronic device 102 may determine the previous swing polarity from a sample of the load voltage measurement that is a set amount of time (e.g., an amount of microseconds, a number of samples, etc.) before switching or before the load voltage spike. In some approaches, the electronic device 102 may determine the previous swing polarity from an average of a number of samples before switching or before the load voltage spike.

If the spike polarity is the same as the previous swing polarity, the electronic device 102 may adjust 708 switching timing to a later timing. This may be accomplished as described in relation to one or more of FIGS. 1-6. The later switching timing may be an amount of time (e.g., a predetermined amount of time or an adaptive amount of time) later than a switching timing (e.g., currently set switching timing) relative to a next voltage swing or cycle. For instance, the electronic device 102 may update the switching timing by adding a predetermined or adaptive time step to a switching timing for a next voltage swing or cycle.

If the spike polarity is different from the previous swing polarity, the electronic device 102 may adjust 710 switching timing to an earlier timing. This may be accomplished as described in relation to one or more of FIGS. 1-6. The earlier switching timing may be an amount of time (e.g., a predetermined amount of time or an adaptive amount of time) earlier than a switching timing (e.g., currently set switching timing) relative to a next voltage swing or cycle. For instance, the electronic device 102 may update the switching timing by subtracting a predetermined or adaptive time step from a switching timing for a next voltage swing or cycle.

Figure 8:
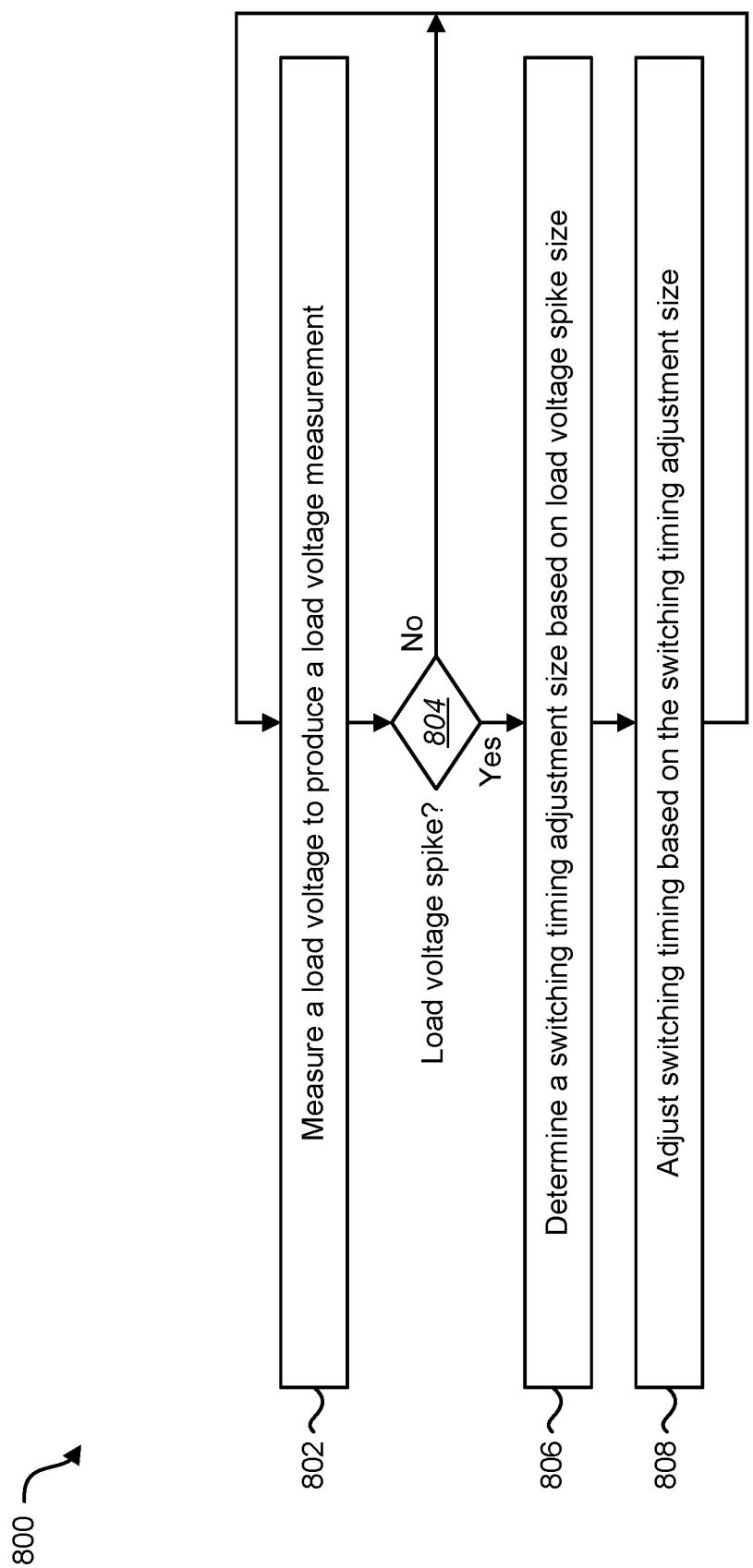
FIG. 8 is a flow diagram illustrating another more specific configuration of a method for controlling switching timing.

FIG. 8 is a flow diagram illustrating another more specific configuration of a method 800 for controlling switching timing. The method 800 may be performed by the electronic device 102 described in relation to FIG. 1. The electronic device 102 may measure 802 a load voltage to produce a load voltage measurement. This may be accomplished as described in relation to one or more of FIGS. 1-2,4, and 7.

The electronic device 102 may determine 804 whether a load voltage spike is indicated by the load voltage measurement. This may be accomplished as described in relation to one or more of FIGS. 1-7. If a load voltage spike is not indicated, switching timing may be maintained and load voltage measuring 802 may continue (for another time period, one or more swings, one or more switches, one or more cycles, etc., for example).

If a load voltage spike is indicated, the electronic device 102 may determine 806 a switching timing adjustment size (e.g., time step size) based on load voltage spike size (e.g., magnitude). This may be accomplished as described in relation to one or more of FIGS. 1 and 7. For example, the load voltage spike size may correlate with the amount of switching time error. Accordingly, the electronic device 102 may utilize the load voltage spike size to determine 806 a switching timing adjustment size. For instance, the electronic device 102 may utilize a function (e.g., a mathematical formula, a look-up table, etc.) that maps load voltage spike size to switching timing adjustment size. Accordingly, larger load voltage spike sizes may map to larger switching timing adjustment sizes, while smaller load voltage spike sizes may map to smaller switching timing adjustment sizes. This may be one approach to adaptively determine switching timing adjustment size (e.g., adaptive time step).

The electronic device 102 may adjust 808 switching timing based on the switching timing adjustment size. This may be accomplished as described in relation to one or more of FIGS. 1 and 7. For example, the electronic device 102 may adjust the switching timing for a next swing or cycle by the switching timing adjustment size. For instance, the electronic device 102 may add the switching timing adjustment size (e.g., time step) to or subtract the switching timing adjustment size from the switching timing (e.g., current set switching timing) for a next swing or cycle.

Figure 9:
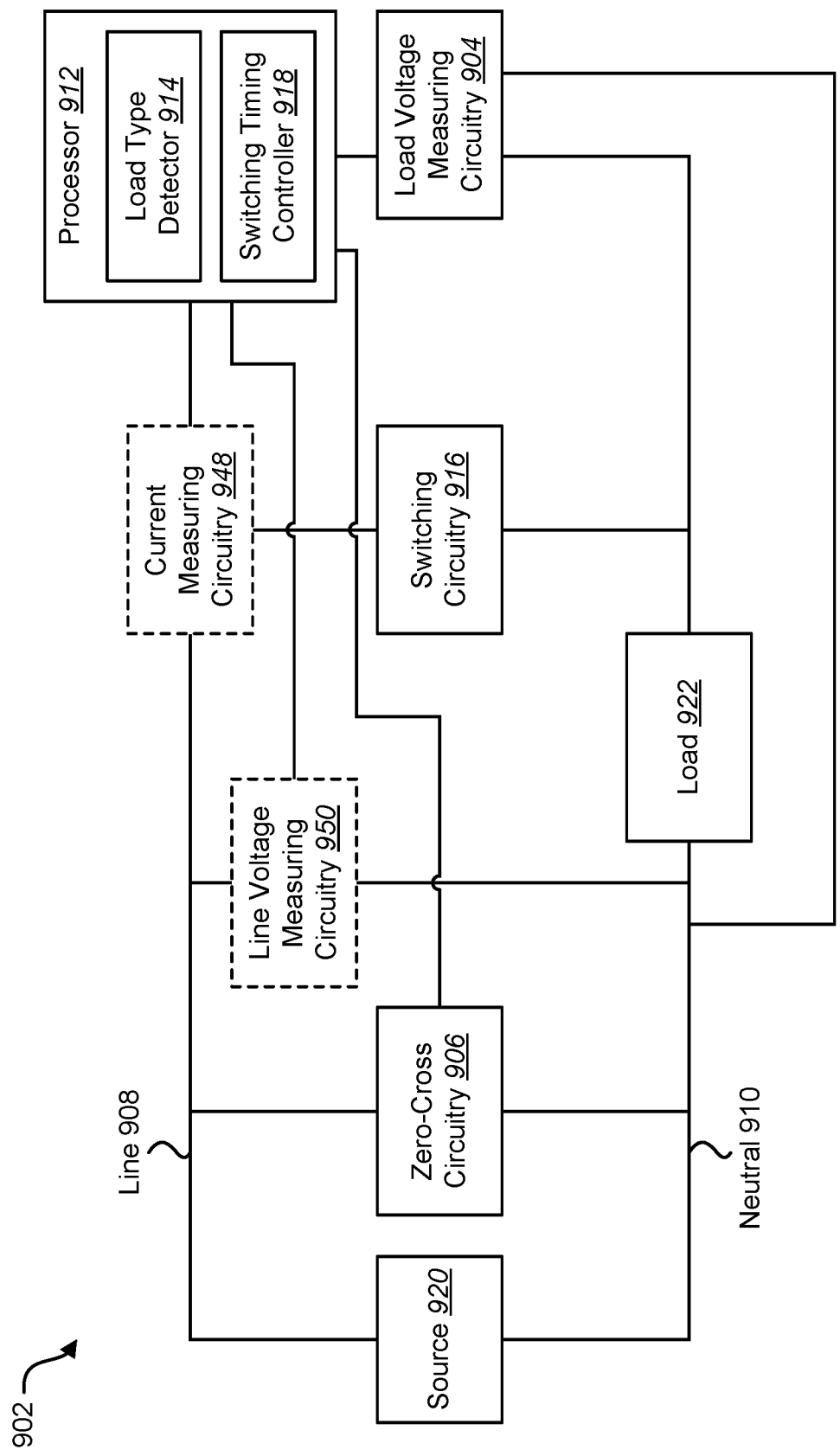
FIG. 9 is a block diagram illustrating a more specific configuration of an electronic device for detecting a load type and controlling switching timing.

FIG. 9 is a block diagram illustrating a more specific configuration of an electronic device 902 for detecting a load type and controlling switching timing. The electronic device 902 may include load voltage measuring circuitry 904, a processor 912, switching circuitry 916, zero-cross circuitry 906, current measuring circuitry 948 (optionally), and/or line voltage measuring circuitry 950 (optionally). The processor 912 may be coupled to the load voltage measuring circuitry 904, to the switching circuitry 916, to the zero-cross circuitry 906, the current measuring circuitry 948, and/or to the line voltage measuring circuitry 950. The electronic device 902 described in relation to FIG. 9 may be an example of the electronic device 102 described in relation to FIG. 1. One or more of the elements or components described in relation to FIG. 9 may function similarly and/or may be implemented similarly to one or more corresponding elements or components described in relation to FIG. 1. For example, the source 920, load 922, zero-cross circuitry 906, switching circuitry 916, processor 912, switching timing controller 918, and/or load voltage measuring circuitry 904 of FIG. 9 may function and/or may be implemented as described in relation to one or more of the source 120, load 122, zero-cross circuitry 106 switching circuitry 116, processor 112, switching timing controller 118, and/or load voltage measuring circuitry 104 of FIG. 1. It should be noted that the source 920 and/or the load 922 may be separate from the electronic device 902, may be coupled to the electronic device 902, and/or may not be included in the electronic device 902.

In some approaches, a current waveform may be compared to line voltage to determine current lag and/or crest factor, which in turn may be used to determine what type of load is attached to an electronic device (e.g., dimmer). However, these approaches may not always give an accurate indication of the attached load type. This may be due to delays in capacitive lighting power supplies and magnetic loads with power factors very close to 1. A load voltage circuit may be implemented in addition to or alternatively from these approaches. For example, load voltage timing versus current may be utilized to determine the load type. Additionally or alternatively, voltage spiking above a set threshold may be utilized to determine what type of load is attached.

In some configurations, load voltage may monitored during a detect sequence on power up. Additionally or alternatively, load type detection may be initialized through a control system (e.g., a device control system, home automation system, etc.). For example, a control system may receive a command from an installer to detect a load type, which may cause a dimmer to run load type detection. If a load voltage spike is detected that exceeds a set threshold, then the load may be an inductive load and the dimmer may accordingly drive the load in forward phase.

Additionally or alternatively, load voltage measuring circuitry may be utilized with current measuring circuitry to determine a lead or lag of current compared to load voltage. In some approaches, crest factor may be calculated between load voltage and current. For example, a crest factor may be calculated for the load voltage measurement and compared to a calculated crest factor for the current measurement. The lead or lag of current and/or crest factor are additional or alternative ways that a load voltage can be utilized to detect load type and/or drive the load in the correct phase. In some approaches, line voltage measuring circuitry may be utilized with the load voltage measuring circuitry to determine load type. In detecting the load type, for example, the load voltage may be monitored. If the load voltage exceeds the line voltage, the load may be an inductive load.

The zero-cross circuitry 906 may detect a line voltage zero cross (e.g., one or more zero cross times for the line voltage). In some configurations, the processor 912 may utilize the line voltage zero cross(ings) to control the switching circuitry 916. For example, the processor 912 may control the state of the switching circuitry 916 (e.g., one or more states of one or more switches, MOSFETs, etc.) in order to coordinate the line voltage zero cross(ings) with switch activation and/or deactivation. For instance, during initialization, switch activation and/or deactivation may initially be coordinated to occur at approximately the same times as line voltage zero crossings. The switching circuitry 916 may be configured to perform switching based on the line voltage zero cross to supply a load voltage (e.g., a load driving voltage when activated). For example, the switching circuitry 916 may perform switching based on a timing of the line voltage zero cross. The load voltage measuring circuitry 904 is configured to measure the load voltage to produce a load voltage measurement (e.g., a voltage waveform).

The current measuring circuitry 948 may be optionally configured to measure a current (e.g., a line 908 current) to produce a current measurement (e.g., a current waveform). For example, the current measuring circuitry 948 may continuously capture the current measurement (e.g., current waveform) by sampling the current (on the line 908, for instance) for one or more cycles. The current measuring circuitry 948 may include discrete components. In some configurations, the current measuring circuitry 948 may only include discrete components. The current measuring circuitry 948 may be coupled in line with the feed line 908 so that the current flowing from the source 920 may be determined.

In some configurations, the current measuring circuitry 948 may capture a continuous time (e.g., analog) current waveform. For example, the current measuring circuitry 948 may capture a continuous time current waveform of the current flowing from the source 920 into the electronic device 902. The continuous time current waveform may indicate how the current varies over each cycle of the AC signal. An example of current waveform sampling is described in relation to FIG. 15. In some configurations, the electronic device 902 may additionally include an ADC for capturing a discrete time (e.g., digital) current waveform of the current (e.g., line 908 current) by sampling the continuous time current waveform. For example, the ADC may sample at sufficient intervals to capture how the current varies over one or more cycles. In some configurations, the ADC may sample the current to correspond to the sampling of the load voltage. The digital current waveform may be one example of the current measurement.

The line voltage measuring circuitry 950 may be configured to measure a voltage (e.g., a line 908 voltage) to produce a line voltage measurement (e.g., a line voltage waveform). For example, the line voltage measuring circuitry 950 may continuously capture the line voltage measurement (e.g., line voltage waveform) by sampling the voltage (between the line 908 and neutral 910, for instance) for one or more cycles. The line voltage measuring circuitry 950 may include discrete components. In some configurations, the line voltage measuring circuitry 950 may only include discrete components. The line voltage measuring circuitry 950 may be coupled between the feed line 908 and neutral 910 so that line voltage may be determined.

In some configurations, the line voltage measuring circuitry 950 may capture a continuous time (e.g., analog) voltage waveform. For example, the line voltage measuring circuitry 950 may capture a continuous time voltage waveform of the line voltage across the source 920. The continuous time voltage waveform may indicate how the line voltage varies over each cycle of the AC signal. Examples of sampling a voltage waveform are described in relation to FIG. 14. In some configurations, the electronic device 902 may additionally include an ADC for capturing a discrete time (e.g., digital) voltage waveform of the line voltage (e.g., line 908 voltage) by sampling the continuous time voltage waveform. For example, the ADC may sample at sufficient intervals to capture how the voltage varies over one or more cycles. In some configurations, the ADC may sample the line voltage to correspond to the sampling of the load voltage and/or the current. The digital line voltage waveform may be one example of the line voltage measurement. One or more line voltage samples and/or line voltage zero crossings may be stored in memory in some implementations.

In some configurations, the electronic device 902 (e.g., adaptive dimmer) may detect a load type. The load type may be detected in order to determine whether to drive the load 922 in forward phase or reverse phase. For example, inductive loads may be driven in forward phase. Capacitive loads may be driven in reverse phase. Driving capacitive loads in reverse phase may provide one or more benefits, such as extending device life and/or providing improved dimming performance. Resistive loads may be driven in either forward phase or reverse phase. Driving resistive loads in reverse phase may provide one or more benefits, such as reducing inrush current and/or reducing ringing. The load type may be detected during initialization (e.g., during "boot-up," during a load type detection mode, etc.). The load type may be detected based on one or more of a load voltage measurement, a line voltage measurement, and/or a current measurement.

In some configurations, the processor 912 may include a load type detector 914 for performing load type detection. In some configurations, the load type detector 914 may perform one or more load type detections. For example, each time the electronic device 902 power cycles (e.g., each time power is initially provided and/or restored to the electronic device 902), the load type detector 914 may detect the load type. In some approaches, load type detection and/or determination may be performed while the electronic device 902 is in an initial set-up mode (e.g., during "boot-up," during initialization, during a detection mode, etc.). In some configurations, the load type detector 914 may perform load type detection multiple times to determine the load type. For example, the load type detector 914 may perform load type detection a number of times (e.g., three) and may determine a load type if all of the detections indicated the same load type. In another example, the load type detector 914 may perform load type detection a number of times (e.g., three, five, etc.) and may determine a load type that is indicated the most. For example, if four detections out of five indicate an inductive load type and one detection indicates a resistive load type, the load type detector 914 may determine (e.g., select) an inductive load type as the detected load type.

The load type detector 914 may determine a load type based on the load voltage measurement. One or more approaches may be implemented to determine the load type based on the load voltage measurement. In some approaches, the load type detector 914 may determine the load type by determining whether a load voltage spike in indicated in the load voltage measurement. For example, inductive loads may produce a load voltage spike in some cases. In particular, if switching (e.g., deactivation) is not performed at a current zero cross, inductive loads may produce a load voltage spike, which may be indicated in the load voltage measurement. Because switching (e.g., deactivation) may be initially timed (e.g., approximately synchronized) with the line voltage zero cross, switching (e.g., deactivation) may not initially occur at the current zero cross, thereby producing a spike for inductive loads.

In some approaches, the load type detector 914 may determine whether a load voltage spike is indicated based on a load type spike threshold (which may be the same as or different from the spike threshold utilized for switching timing control, for instance). For example, if the load voltage measurement exceeds the load type spike threshold, then the load type detector 914 may determine that the load voltage spike is indicated. In some configurations, the load type spike threshold may be predetermined and/or static. For example, the load type spike threshold may be set at a particular voltage. In some approaches, the load type spike threshold may be applied to a particular time segment of the load voltage measurement. For example, a time segment of the load voltage measurement corresponding to a period after a switch deactivation may be compared to the load type spike threshold. In a case that the load type spike threshold is exceeded, the load type detector 914 may determine that a voltage spike is indicated and/or that the load 922 is an inductive load. For example, if the load type spike threshold is exceeded, the processor 912 may control the switching circuitry 916 to drive the load 922 in forward phase. If the load type spike threshold is not exceeded (e.g., the load voltage threshold is less than or equal to the load type spike threshold), the load type detector 914 may determine that voltage spike is not indicated and/or that the load 922 is a resistive load or capacitive load. For example, if the load type spike threshold is not exceeded, the load type detector 914 may control the switching circuitry 916 to drive the load 922 in reverse phase.

It should be noted that one or more load type spike thresholds may be utilized. For example, a positive load type spike threshold and a negative load type spike threshold may be utilized. For instance, the load type detector 914 may determine whether the load voltage measurement exceeds (e.g., is greater than) the positive load type spike threshold or whether the load voltage measurement exceeds (e.g., is less than or is greater in magnitude than) the negative load type spike threshold. A voltage spike may be indicated if the positive load type spike threshold or the negative load type spike threshold is exceeded. One or more voltage load type spike thresholds may be stored in memory in some implementations.

In some configurations, the load type spike threshold may be based on a line voltage. For example, the electronic device 902 may include line voltage measuring circuitry 950. The processor 912 (e.g., load type detector 914) may calculate the load type spike threshold based on a line voltage measurement produced by the line voltage measuring circuitry 950. For instance, the load type spike threshold(s) may be an amount (in voltage) above the line voltage measurement (and/or an amount below the line voltage measurement). Accordingly, the load type spike threshold(s) may be calculated relative to the line voltage measurement and may be compared to the load voltage measurement. In some approaches, the load type spike threshold (that is based on the line voltage measurement, for example) may be applied over one or more entire cycles. In other approaches, the load type spike threshold may be applied to a particular time segment of the load voltage measurement. For example, a time segment of the load voltage measurement corresponding to a period after a switch deactivation may be compared to the load type spike threshold. In a case that the load type spike threshold is exceeded, the load type detector 914 may determine that a voltage spike is indicated and/or that the load 922 is an inductive load. For example, if the load type spike threshold is exceeded, the processor 912 may control the switching circuitry 916 to drive the load 922 in forward phase. If the load type spike threshold is not exceeded (e.g., the load voltage threshold is less than or equal to the load type spike threshold), the load type detector 914 may determine that voltage spike is not indicated and/or that the load 922 is a resistive load or capacitive load. For example, if the load type spike threshold is not exceeded, the load type detector 914 may control the switching circuitry 916 to drive the load 922 in reverse phase.

The zero-cross circuitry 906 may detect a line voltage zero cross (e.g., one or more zero cross times for the line voltage). In some configurations, the one or more line voltage zero crossings may be indicated to the processor 912. For example, the zero-cross circuitry 906 may send a signal (e.g., a step signal, a bit, a code, etc.) to the processor 912 that indicates the timing for the one or more line voltage zero crossings. The processor 912 may utilize the line voltage zero cross(ings) to control the switching circuitry 916. For example, the processor 912 may control the state of the switching circuitry 916 (e.g., one or more states of one or more switches, MOSFETs, etc.) in order to coordinate the switch activation and/or deactivation with line voltage zero cross(ings).

In some configurations, the switching circuitry 916 may be configured to perform switching based on the line voltage zero cross to supply a load voltage (e.g., a load driving voltage when activated). For example, the switching circuitry 916 may perform switching based on a timing of the line voltage zero cross during initialization (e.g., during a "boot-up" mode, during initialization, during load type detection, etc.). For instance, the switching circuitry 916 may switch at (approximately) one or more line voltage zero crossings during load type detection. In some approaches, the switching circuitry 916 may receive a control signal from the processor 912 indicating one or more times to perform switching based on the line voltage zero cross (ings).

In some configurations, for example, the switching circuitry 916 may include two switches (e.g., MOSFETs, MOSFETs with coupled drains, etc.). A first switch may be activated and a second switch may be deactivated at a rising-edge zero cross of the line voltage. The first switch may be deactivated and the second switch may be activated at a falling-edge zero cross of the line voltage. This switching pattern may be performed one or more times for one or more cycles of the line voltage.

In some configurations, the electronic device 902 (e.g., processor 912, load type detector 914, etc.) may determine a load type based on a current measurement and the load voltage measurement. For example, the electronic device 902 may include current measuring circuitry 948 that measures a current (e.g., line current). For instance, the current measuring circuitry 948 may capture one or more samples of a current waveform. One or more current samples and/or current zero crossings may be stored in memory in some implementations. Examples of current samples are given in relation to FIG. 15. Examples of current zero crossings are given in relation to FIG. 17. The load type detector 914 may compare a zero cross of the current measurement to a load voltage zero cross (of the load voltage measurement, for example). In some configurations, the electronic device 902 (e.g., current measuring circuitry 948, current scaling circuitry, processor 912, etc.) may scale the current measurement and/or current samples.

For example, the load type detector 914 may determine the load type based on the load voltage zero cross and a current zero cross. For instance, the load type detector 914 may determine a zero-cross difference (e.g., $\Delta_{ZX}=I_{ZX}-V_{ZX}$) between the load voltage measurement and the current measurement to determine the load type. If the load type detector 914 determines that the current zero cross occurs before (e.g., leads) the load voltage zero cross (e.g., $\Delta_{ZX}<0$), then the load type detector 914 may determine that the load 922 is a capacitive load type. In this case, the time associated with the current zero cross is before the time associated with the load voltage zero cross. In other words, if the current zero cross leads the load voltage zero cross, then the load 922 may be determined to have capacitive impedance. In this case, the processor 912 may control the switching circuitry 916 to drive the load 922 in reverse phase.

It should be noted that the term "difference" and variations thereof as used herein (e.g., a zero-cross difference, a slope difference, etc.) may include one or more types of conceptual difference and/or difference measures. For example, a "difference" may mean a mathematical subtraction, a ratio, a comparison (e.g., whether one quantity is greater than, equal to, or less than another quantity), an order (e.g., ranking), and/or a sequence (e.g., whether an event happens before, during, or after another event), etc.

If the load type detector 914 determines that the load voltage zero cross occurs before the current zero cross (e.g., $\Delta_{ZX}>0$), then the load type detector 914 may determine that the load 922 is an inductive load type. In this case, the time associated with the load voltage zero cross occurs before the time associated with the current zero cross. In other words, if the load voltage zero cross leads the current zero cross (e.g., the current zero cross lags the load voltage zero cross), then the load 922 may be determined to have inductive impedance. In this case, the processor 912 may control the switching circuitry 916 to drive the load 922 in forward phase.

If the load type detector 914 determines that the load voltage zero cross is equal to (or within a range of) the current zero cross (e.g., $\Delta_{ZX}\approx0$), then the load type detector 914 may determine that the load type is resistive. It should be noted that if the value of the load voltage zero cross is within a specified range of the value of the current zero cross, the load type detector 914 may treat the load voltage zero cross (time) and current zero cross (time) as equal. For example, if the load voltage zero cross is within one or more threshold or tolerance amounts of time or time samples of the current zero cross (leading and/or lagging), the load voltage zero cross and the current zero cross may be deemed equal in some configurations of the systems and methods disclosed herein. If the load voltage zero cross is equal to the current zero cross, then the load 922 may be determined to be a resistive load type. In this case, the processor 912 may control the switching circuitry 916 to drive the load 922 in reverse phase.

In some approaches, the load type detector 914 may simply determine whether the load voltage zero cross occurs before the current zero cross (e.g., $\Delta_{ZX}>0$) to indicate an inductive load type. If the load voltage zero cross occurs before the current zero cross, the processor 912 may control the switching circuitry 916 to drive the load 922 in forward phase (for an inductive load). Otherwise, the processor 912 may control the switching circuitry 916 to drive the load 922 in reverse phase (for a resistive or capacitive load).

In some configurations, the load type detector 914 may determine a slope (e.g., rise/run, crest factor, etc.) of one or more measurements. For example, the load type detector 914 may determine a slope (e.g., rise/run, crest factor, etc.) of the load voltage measurement and/or a slope (e.g., rise/run, crest factor, etc.) of the current measurement. For instance, the load type detector 914 may determine a slope difference (e.g., crest factor difference) between the load voltage measurement slope and the current measurement slope. The slope difference may indicate the load type.

In some configurations, the load type detector 914 may determine a load type based on a combination of factors. For example, the load type detector 914 may determine the load type based on whether a voltage spike is indicated by the load voltage measurement (e.g., voltage spike factor), based on a zero-cross difference between the load voltage measurement and the current measurement (e.g., zero-cross factor), and/or based on a slope difference between the load voltage measurement and the current measurement (e.g., slope factor). Each of the factors may be determined as described above. In some approaches, the load type may be determined based on a majority of factors. For example, if at least two of the three factors (e.g., two of the voltage spike factor, zero-cross factor, and slope factor) indicate the same load type, the load type detector 914 may determine that load type for the load 922. In some approaches, the load type may be determined based on unanimous factors. For example, two or three factors may be utilized, and the load type detector 914 may determine the load type only if all of the factors agree regarding the load type. If one or more factors disagree, the load type detection routine may be repeated until all of the factors are unanimous.

In some approaches, the load type detector 914 may only analyze the current information (e.g., current waveform, current zero cross, and/or current slope) with the load voltage measurement depending on the load type detection based on a voltage spike. For example, if the load type detector 914 detects an inductive load type because a voltage spike threshold is exceeded, the load type detector 914 may not utilize (e.g., determine and/or compare current) current information (e.g., current zero cross and/or current slope). Additionally or alternatively, if the load type detector 914 detects an inductive load type because a voltage spike threshold is exceeded, the load type detector 914 may not utilize (e.g., determine and/or compare current) load voltage zero cross and/or load voltage slope. If the voltage spike analysis indicates that the load type is not inductive, current information (e.g., current zero cross and/or current slope) may be utilized to further determine whether the load type is resistive or capacitive.

In some approaches, in addition to one or more of the configurations and/or approaches described above, the load type detection routine may be performed (e.g., repeated) a number of times. Each load type detection may indicate a detected load type (e.g., inductive or not inductive; inductive, capacitive, or resistive; etc.). The load type detections may be utilized to make a (final) determination on the load type. In some approaches, a threshold number of agreeing load type detections may need be satisfied in order to make the load type determination. For example, at least three load type detections may be required to agree for the final load type determination. For instance, as soon as a number of (e.g., three) load type detections agree, the final load type determination may be the load type of the agreeing load type detections. In another example, the threshold may require a minimum proportion of load type detections (e.g., a minimum percentage of a minimum number of detections, at least 75% of at least four detection routines, etc.). The load type detection routine may be repeated until the one or more criteria are satisfied and/or until a failure threshold is reached. If the failure threshold is reached, a fault indication may be provided (e.g., a fault light may be activated, a fault message may be displayed, a fault message may be communicated to a control system, etc.) For example, if the one or more criteria are not satisfied with 10 load type detection routines, the fault indication may be provided.

The processor 912 may be configured to control the switching circuitry 916 to drive the load 922 based on the load type. For example, the processor 912 may control the switching circuitry 916 to drive the load 922 in forward phase if the load type is inductive or may control the switching circuitry 916 to drive the load 922 in reverse phase if the load type is capacitive or resistive.

In some configurations, the electronic device 902 (e.g., processor 912) may additionally or alternatively adjust how the load 922 is driven based on the load type. For example, the electronic device 902 may adjust its own impedance to improve the efficiency (e.g., power factor) for the circuit. Thus, the electronic device 902 may determine the load type to enhance the efficiency of the circuit. In some approaches, the processor 912 may adjust the driving voltage waveform and/or current waveform to enhance efficiency (e.g., increase the power factor by adjusting the phase margin). For example, the processor 912 may adjust the duty cycle and/or the amount of power delivered to the load 922 to enhance efficiency (e.g., limiting the watts provided to correspond with the watts consumed).

The switching timing controller 918 may control switching timing as described in relation to one or more of FIGS. 1-8. For example, the switching timing controller 918 may control switching timing based on one or more detected load voltage spikes in the load voltage measurement after initialization. In some configurations, the switching timing controller 918 may only control switching timing based on load voltage spiking in a case that the load 922 is detected as an inductive load type.

It should be noted that one or more of the elements or components described in relation to FIG. 9 may be combined and/or divided in some configurations. For example, the zero-cross circuitry 906, switching circuitry 916, processor 912, load voltage measuring circuitry 904, current measuring circuitry 948, and/or line voltage measuring circuitry 950 may be divided into smaller elements or components that perform a subset of the functions described herein. Additionally or alternatively, one or more of the zero-cross circuitry 906, switching circuitry 916, processor 912, load voltage measuring circuitry 904, current measuring circuitry 948, and/or line voltage measuring circuitry 950 may be combined. For example, the line voltage measuring circuitry 950 may be combined with the zero-cross circuitry 906 in some configurations. Alternatively, the line voltage zero cross may be determined (by the line voltage measuring circuitry 950 and/or the processor 912) based on the line voltage measurement (e.g., line voltage waveform).

Figure 10:
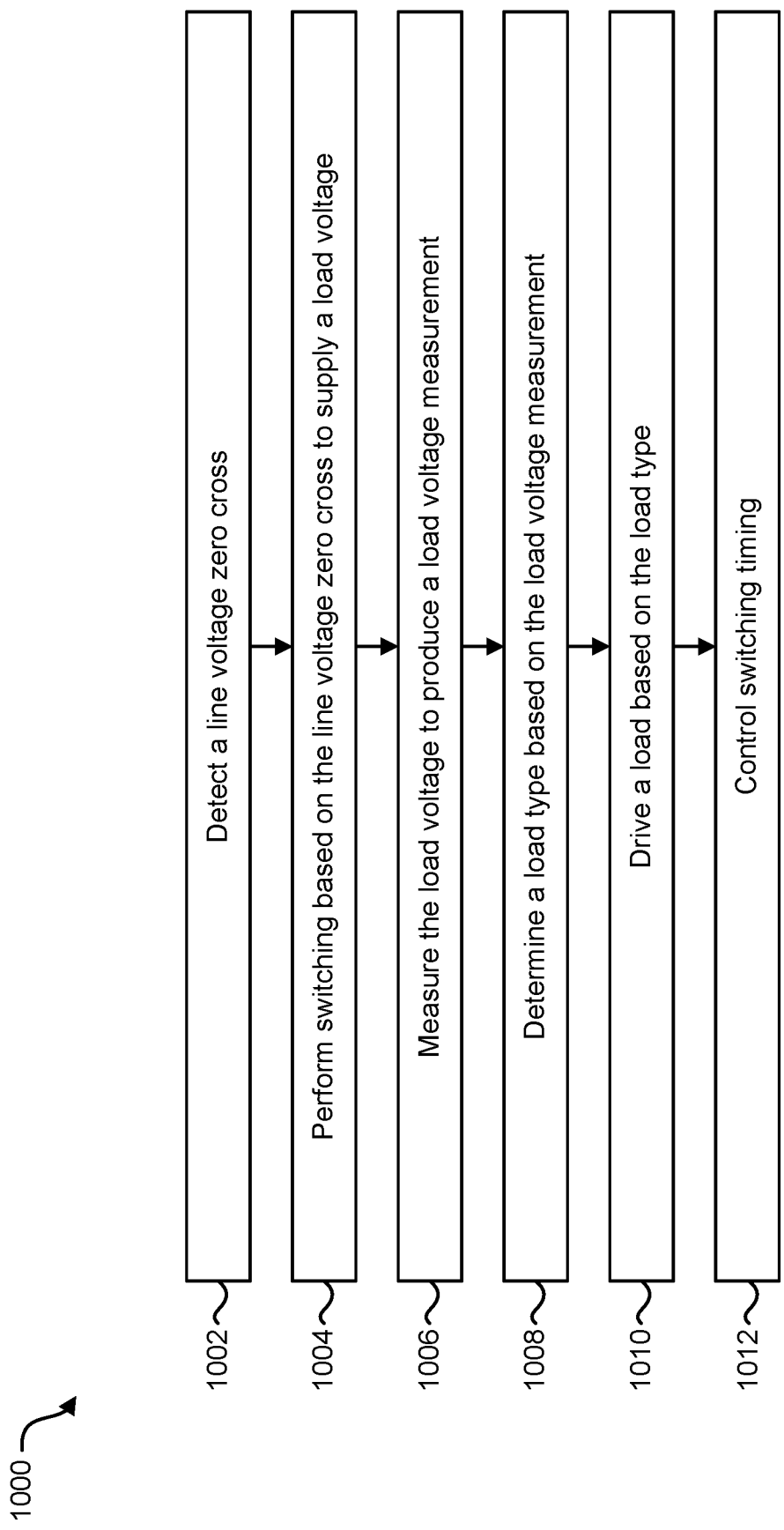
FIG. 10 is a flow diagram illustrating one configuration of a method for detecting a load type.

FIG. 10 is a flow diagram illustrating one configuration of a method 1000 for detecting a load type. The method 1000 may be performed by the electronic device 902 described in relation to FIG. 9. The electronic device 902 may detect 1002 a line voltage zero cross. This may be accomplished as described in relation to FIG. 9. For example, the electronic device 902 (e.g., zero-cross circuitry 906) may detect when voltage polarity changes and/or when zero potential occurs between the line 908 and neutral 910.

The electronic device 902 may perform 1004 switching based on the line voltage zero cross to supply a load voltage. This may be accomplished as described in relation to FIG. 9. For example, the processor 912 may control the switching circuitry 916 to supply one or more cycles of load voltage (to the load 922, for example). In some configurations, the processor 912 may time one or more switch activations and/or deactivations to synchronize (e.g., approximately synchronize) switching with one or more line voltage zero crossings.

The electronic device 902 may measure 1006 the load voltage to produce a load voltage measurement. This may be accomplished as described in relation to FIG. 9. For example, the electronic device 902 (e.g., load voltage measuring circuitry 904) may measure 1006 the load voltage as a load voltage measurement (e.g., a voltage waveform, a series of voltage data samples, etc.). The load voltage measurement may indicate the load voltage (e.g., voltage across a load 922) for one or more cycles (e.g., AC voltage cycles).

The electronic device 902 may determine 1008 a load type based on the load voltage measurement. This may be accomplished as described in relation to FIG. 9. For example, the electronic device 902 (e.g., processor 912) may determine whether a load voltage spike is indicated by the load voltage measurement. A load voltage spike may be indicated in a case that the load voltage measurement exceeds a spike threshold (e.g., a predetermined spike threshold or a spike threshold determined based on measuring a line voltage). Additionally or alternatively, the electronic device 902 may compare a load voltage zero cross and a current zero cross. Additionally or alternatively, the electronic device 902 (e.g., processor 912) may compare a load voltage measurement slope (e.g., crest factor) and a current measurement slope (e.g., crest factor). One or more of these factors (e.g., voltage spike factor, zero-cross factor, and/or slope factor) may be utilized to determine the load type. For example, the presence of a load voltage spike may indicate an inductive load type, while the absence thereof may indicate a non-inductive (e.g., capacitive or resistive) load type. A lagging current zero cross may indicate an inductive load type, a leading current zero cross may indicate a capacitive load type, and/or approximately synchronized zero cross (between load voltage and current, for example) may indicate a resistive load type. Particular slope differences may indicate different load types. The load type may be determined based on one or more of these factors and/or based on one or more load type detection routines (e.g., performing load type detection a number of times) as described in relation to FIG. 9.

The electronic device 902 may drive 1010 a load based on the load type. This may be accomplished as described in relation to FIG. 9. For example, the electronic device 902 may drive an inductive load in forward phase and may drive a resistive or capacitive load in reverse phase. In some configurations, the electronic device 902 may adjust one or more other aspects of operation based on the load type as described in relation to FIG. 9.

The electronic device 902 may control 1012 switching timing. This may be accomplished as described in relation to one or more of FIGS. 1-9. In some configurations, the electronic device 902 may optionally control 1012 switching timing based on the load type. For example, the electronic device 902 may only control 1012 switching timing based on load voltage spiking in a case that an inductive load type is detected. For example, if an inductive load type is detected, the electronic device 902 may measure load voltage to produce a load voltage measurement (after initialization, for instance). Then, the electronic device 902 may determine whether a load voltage spike is indicated by the load voltage measurement and control switching timing based on whether a load voltage spike is indicated. If the load type is detected as non-inductive (e.g., resistive or capacitive), the electronic device 902 may not perform switching timing control based on load voltage spiking in some configurations. In other configurations, the electronic device 902 may perform switching timing control regardless of the load type detected.

Figure 11:
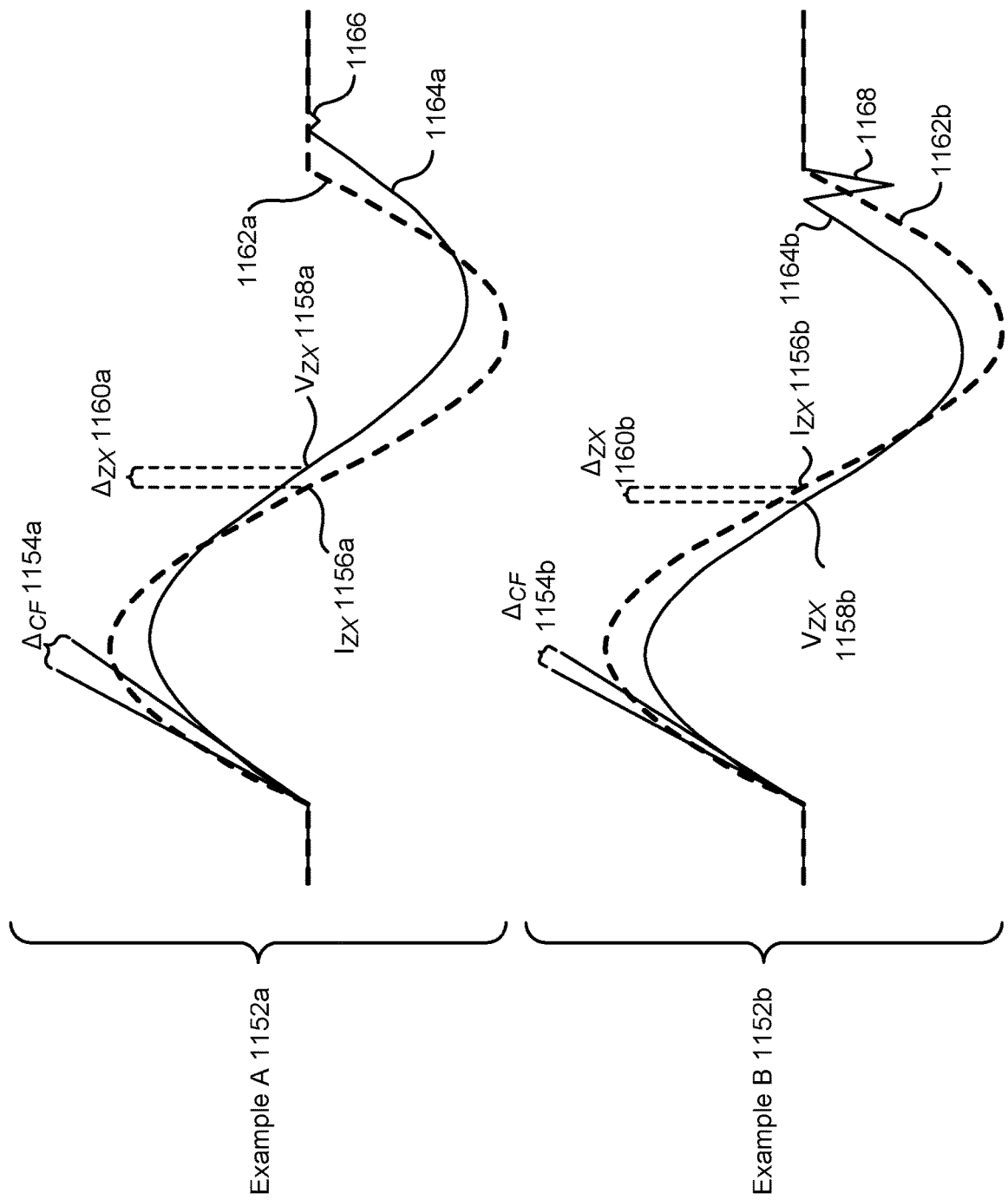
FIG. 11 is a diagram illustrating examples of voltages and currents.

FIG. 11 is a diagram illustrating examples 1152a-b of voltages 1164a-b and currents 1162a-b. In particular, FIG. 11 illustrates examples 1152a-b of characteristics of load voltages 1164a-b and/or currents 1162a-b that may be utilized to determine a load type in accordance with some configurations of the systems and methods disclosed herein. For example, the electronic device 902 described in relation to FIG. 9 may utilize one or more of the characteristics to determine the load type. The load voltages 1164a-b and/or currents 1162a-b may be expressed as load voltage measurements and/or current measurements in accordance with some configurations of the systems and methods disclosed herein.

Example A 1152a illustrates a load voltage 1164a and a current 1162a (e.g., line current) in a case of a capacitive load type. As illustrated, the current 1162a leads the load voltage 1164a. For example, the current zero cross 1156a (e.g., $I_{ZX}$) occurs before the voltage zero cross 1158a (e.g., $V_{ZX}$). When performing initial switching (e.g., during load type detection), an electronic device may approximately synchronize switching at voltage zero crossings. For example, the electronic device may activate or deactivate switches at each voltage zero cross. In example A 1152a, switching may be performed at the beginning of the cycle, at the falling edge zero cross 1158a, and/or at the rising edge zero cross of the load voltage 1164a. As illustrated in example A 1152a, a voltage spike does not occur 1166 upon performing switching at the end of the cycle of the load voltage 1164a, which may indicate a capacitive (or resistive) load type.

In example A 1152a, a zero-cross difference 1160a (e.g., $\Delta_{ZX}=I_{ZX}-V_{ZX}$) may indicate that the current 1162a leads the load voltage 1164a (e.g., the current zero cross 1156a (e.g., $I_{ZX}$) occurs before the voltage zero cross 1158a (e.g., $V_{ZX}$)), which may indicate a capacitive load type. Additionally or alternatively, a slope difference 1154a (e.g., crest factor difference $\Delta_{CF}$) of a particular size may indicate a capacitive load type.

Example B 1152b illustrates a load voltage 1164b and a current 1162b (e.g., line current) in a case of an inductive load type. As illustrated, the current 1162b lags the load voltage 1164b. For example, the current zero cross 1156b (e.g., $I_{ZX}$) occurs after the voltage zero cross 1158b (e.g., $V_{ZX}$). When performing initial switching (e.g., during load type detection), an electronic device may approximately synchronize switching at voltage zero crossings. For example, the electronic device may activate or deactivate switches at each voltage zero cross. In example B 1152b, switching may be performed at the beginning of the cycle, at the falling edge zero cross 1158b, and/or at the rising edge zero cross of the load voltage 1164b. As illustrated in example B 1152b, a voltage spike 1168 occurs upon performing switching at the end of the cycle of the load voltage 1164b, which may indicate an inductive load type.

In example B 1152b, a zero-cross difference 1160b (e.g., $\Delta_{ZX}=I_{ZX}-V_{ZX}$) may indicate that the current 1162b lags the load voltage 1164b (e.g., the current zero cross 1156b (e.g., $I_{ZX}$) occurs after the voltage zero cross 1158b (e.g., $V_{ZX}$)), which may indicate an inductive load type. Additionally or alternatively, a slope difference 1154b (e.g., crest factor difference $\Delta_{CF}$) of a particular size may indicate an inductive load type.

Figure 12:
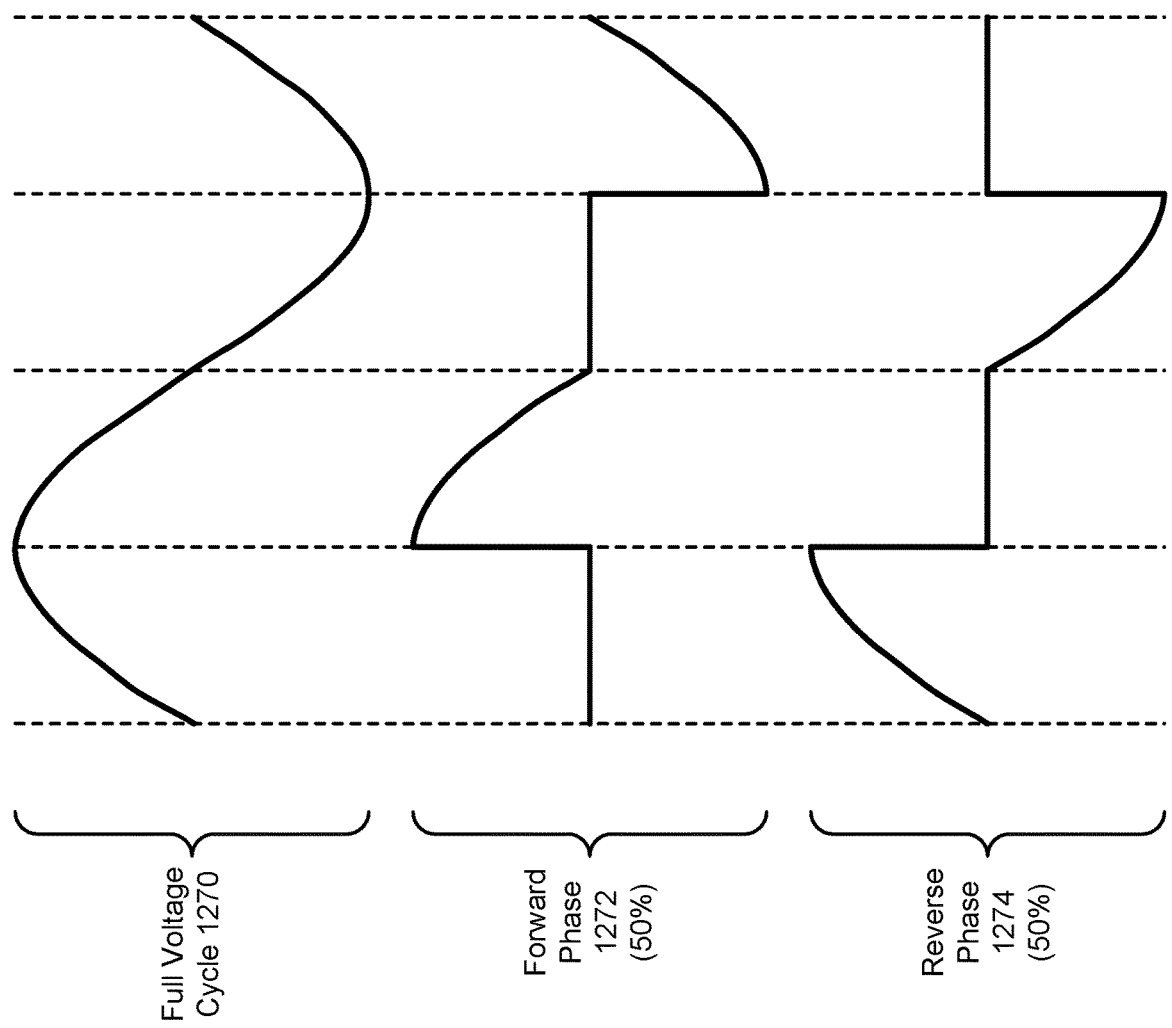
FIG. 12 is a diagram illustrating an example of a forward phase voltage waveform and a reverse phase voltage waveform.

FIG. 12 is a diagram illustrating an example of a forward phase 1272 voltage waveform and a reverse phase 1274 voltage waveform. In particular, FIG. 12 illustrates an example of a full voltage cycle 1270 for an AC voltage. Some devices (e.g., phase-cut dimmers) may cut (e.g., switch off) one or more portions of a voltage cycle in order to drive a load at a particular level (e.g., power, voltage, etc.). For example, a "front" (e.g., initial) part of the upswing or downswing of a voltage cycle may be cut to drive a load in forward phase. A "back" (e.g., latter) part of the upswing or downswing of a voltage cycle may be cut to drive a load in reverse phase. Different amounts (e.g., proportions) of the voltage cycle may be cut in order to drive the load at different levels (e.g., different power levels).

In the forward phase 1272 example illustrated in FIG. 12, the full voltage cycle 1270 is cut by 50% in order to drive a load at a 50% level. As shown by the forward phase 1272 example, half of the front (e.g., initial) part of the upswing is cut (e.g., switched off) and half of the front part of the downswing is cut (e.g., switched off). As described herein, it may be beneficial to drive inductive loads in forward phase.

In the reverse phase 1274 example illustrated in FIG. 12, the full voltage cycle 1270 is cut by 50% in order to drive a load at a 50% level. As shown by the reverse phase 1274 example, half of the back (e.g., latter) part of the upswing is cut (e.g., switched off) and half of the back part of the downswing is cut (e.g., switched off). As described herein, it may be beneficial to drive resistive loads and/or capacitive loads in reverse phase.

Figure 13:
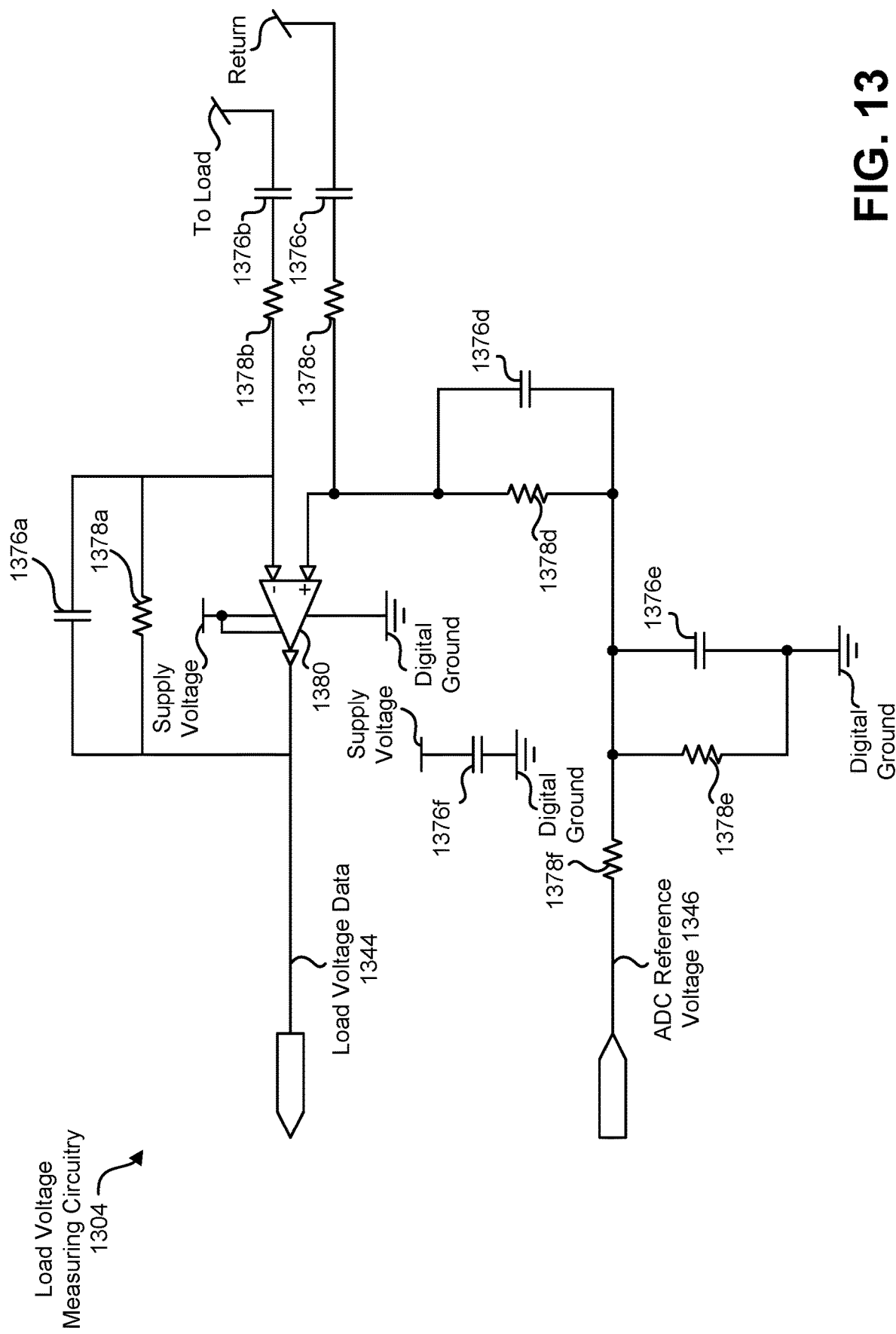
FIG. 13 is a circuit diagram illustrating one example of load voltage measuring circuitry that may be implemented in accordance with some configurations of the systems and methods disclosed herein.

FIG. 13 is a circuit diagram illustrating one example of load voltage measuring circuitry 1304 that may be implemented in accordance with some configurations of the systems and methods disclosed herein. As illustrated in FIG. 13, the load voltage measuring circuitry may include capacitors 1376a-f, resistors 1378a-f, and an amplifier 1380. The load voltage measuring circuitry 1304 may include a load coupling (e.g., terminal) and a return (e.g., neutral) coupling (e.g., terminal). The load voltage measuring circuitry 1304 may be coupled to a supply voltage (e.g., 3 V) and to digital ground. The load voltage measuring circuitry 1304 may receive an ADC reference voltage 1346. The ADC reference voltage 1346 may be a reference voltage (e.g., 1.2 V) from a processor in some configurations.

In some configurations, example values for the capacitors 1376a-f and resistors 1178a-f may be given as follows. Capacitor A 1376a may have a 10 picofarad (pf) capacitance, capacitor B 1376b may have a 22 microfarad (µF) capacitance, capacitor C 1376c may have a 22 µF capacitance, capacitor D 1376d may have a 10 pf capacitance, capacitor E 1376e may have a 47 µF capacitance, and/or capacitor F 1376f may have a 0.1 µF capacitance. Resistor A 1378a may have a 3.3 kiloohm (kΩ) resistance, resistor B 1378b may have a 3.3 megaohm (MΩ) resistance, resistor C 1378c may have a 3.3 MΩ resistance, resistor D 1378d may have a 3.3 kΩ resistance, resistor E 1378e may have a 10 kΩ resistance, and/or resistor F 1378f may have a 10 kΩ resistance. The load voltage measuring circuitry 1304 may measure (e.g., sample) the load voltage between the load and the return couplings. For example, the amplifier 1380 may provide load voltage data 1344 (e.g., one or more load voltage samples) to a processor. The load voltage data 1344 may provide or be an example of the load voltage measurement described herein. For example, a series of load voltage data 1344 (over one or more cycles, for example) may provide a load voltage measurement. The load voltage measuring circuitry 1304 may take the differential between return and load. The differential may be direct current (DC) decoupled and then amplified to be centered between the ADC reference voltage.

Figure 14:
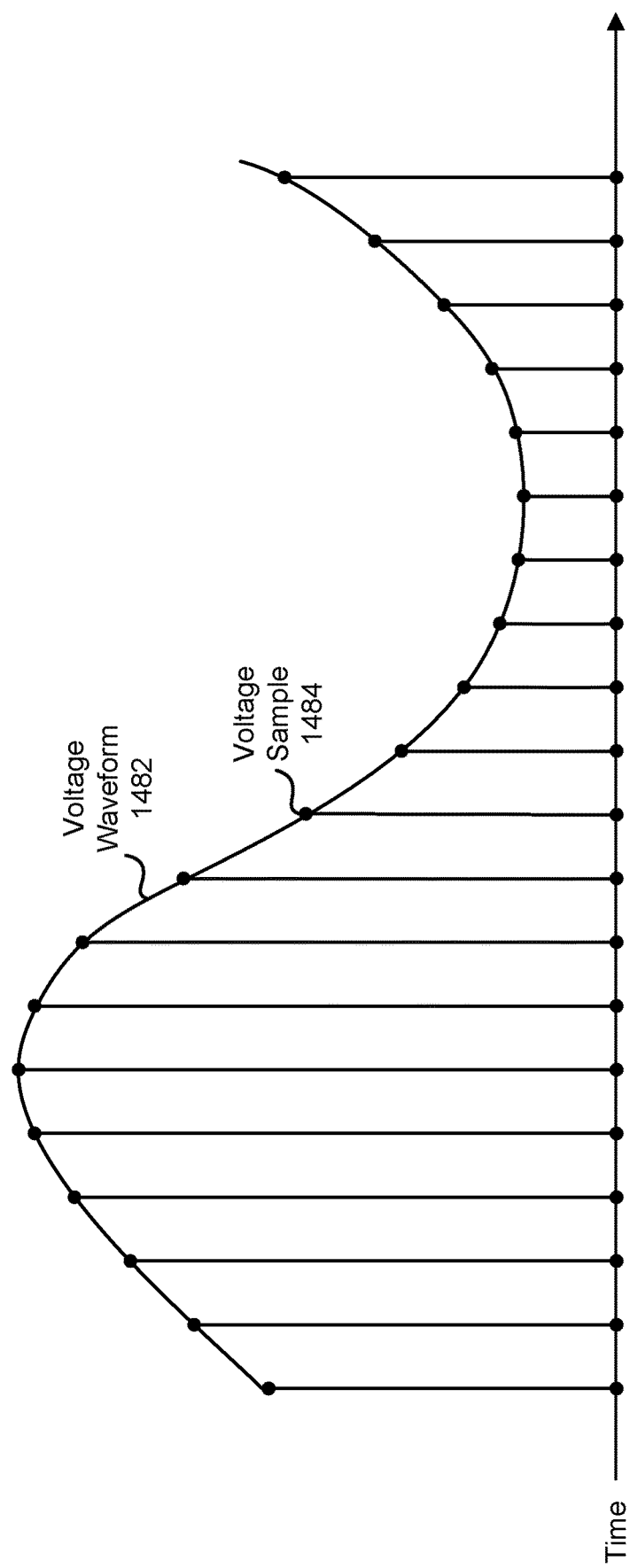
FIG. 14 illustrates an example of a voltage waveform.

FIG. 14 illustrates an example of a voltage waveform 1482. The voltage waveform 1482 may correspond to a continuous alternating current (AC) voltage signal. The voltage waveform 1482 may be captured by sampling the continuous AC signal to produce a discrete (e.g., digital) signal. For example, the voltage waveform 1482 may include multiple voltage samples 1484. Each voltage sample 1484 may correspond to a voltage amplitude measured at discrete time intervals. Therefore, each voltage sample 1484 may be associated with a particular voltage amplitude and a particular time.

In some configurations, the voltage waveform 1482 may be captured by one or more of the electronic devices described herein. For example, load voltage measurement circuitry may continuously capture the voltage waveform 1482 by sampling the voltage waveform 1482 for one or more cycles of AC. For example, the load voltage measurement circuitry may sample the voltage waveform 1482 across a load. In some configurations, the line voltage measurement circuitry may similarly sample a voltage waveform between a line feed and neutral. The electronic device may use an ADC for capturing a discrete time (e.g., digital) voltage waveform 1482 of the AC signal by sampling the continuous time voltage waveform 1482 captured by the voltage sensor. In some implementations, the electronic device may place the voltage samples 1484 in memory (e.g., on-board processor memory, separate memory, etc.) for use in detecting a load type and/or detecting load coupling. In some configurations, a processor (e.g., processor 112, processor 912, etc.) may include a set of program instructions for utilizing the load voltage measuring circuitry to capture the voltage waveform 1482.

Figure 15:
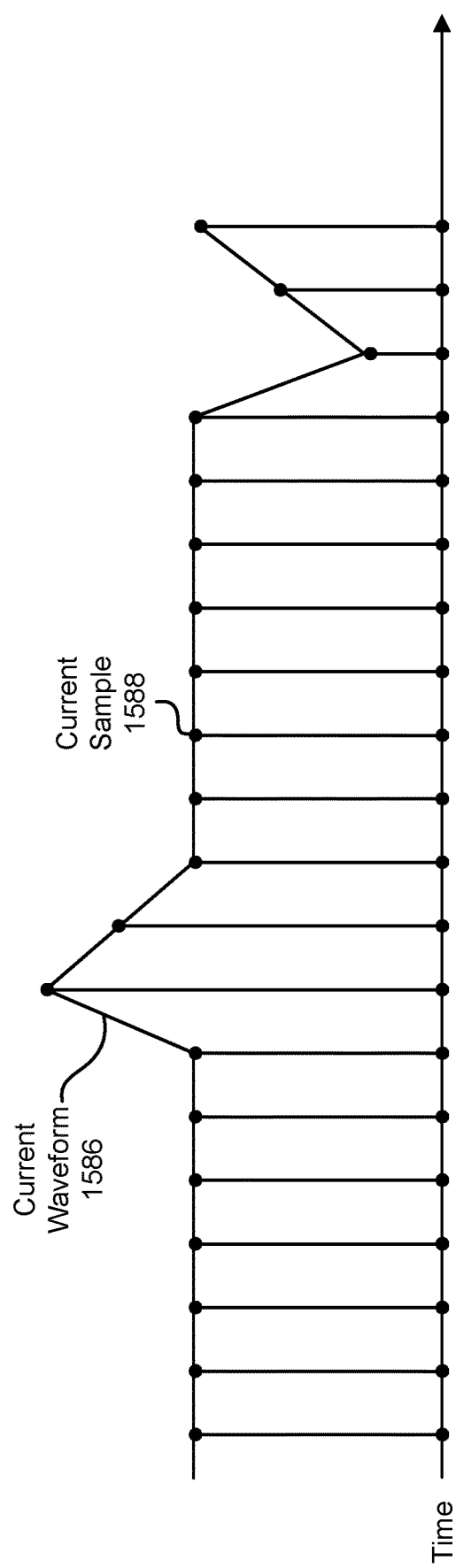
FIG. 15 illustrates an example of a current waveform.

FIG. 15 illustrates an example of a current waveform 1586. The current waveform 1586 may correspond to a continuous alternating current (AC) signal. The current waveform 1586 may be captured by sampling the continuous AC signal to produce a discrete (e.g., digital) signal. For example, the current waveform 1586 may include multiple current samples 1588. Each current sample 1588 may correspond to current amplitude measured at discrete time intervals. Therefore, each current sample 1588 may be associated with a particular current amplitude and a particular time.

In one configuration, the current waveform 1586 may be captured by an electronic device (e.g., current measuring circuitry) as described herein. For example, current measuring circuitry may continuously capture the current waveform 1586 by sampling the current waveform 1586 for one or more cycles of AC. The current measuring circuitry may capture a continuous time current waveform 1586 of the current from the source. The electronic device may use an ADC for capturing a discrete time (e.g., digital) current waveform 1586 of the AC signal by sampling the continuous time current waveform 1586 captured by the current measuring circuitry. In some configurations, the electronic device may place the current samples 1588 in memory (e.g., on-board processor memory, separate memory, etc.) for use in detecting a load type. In some configurations, a processor (e.g., processor 112) may include a set of program instructions for utilizing the current measuring circuitry to capture the current waveform 1586.

Figure 16:
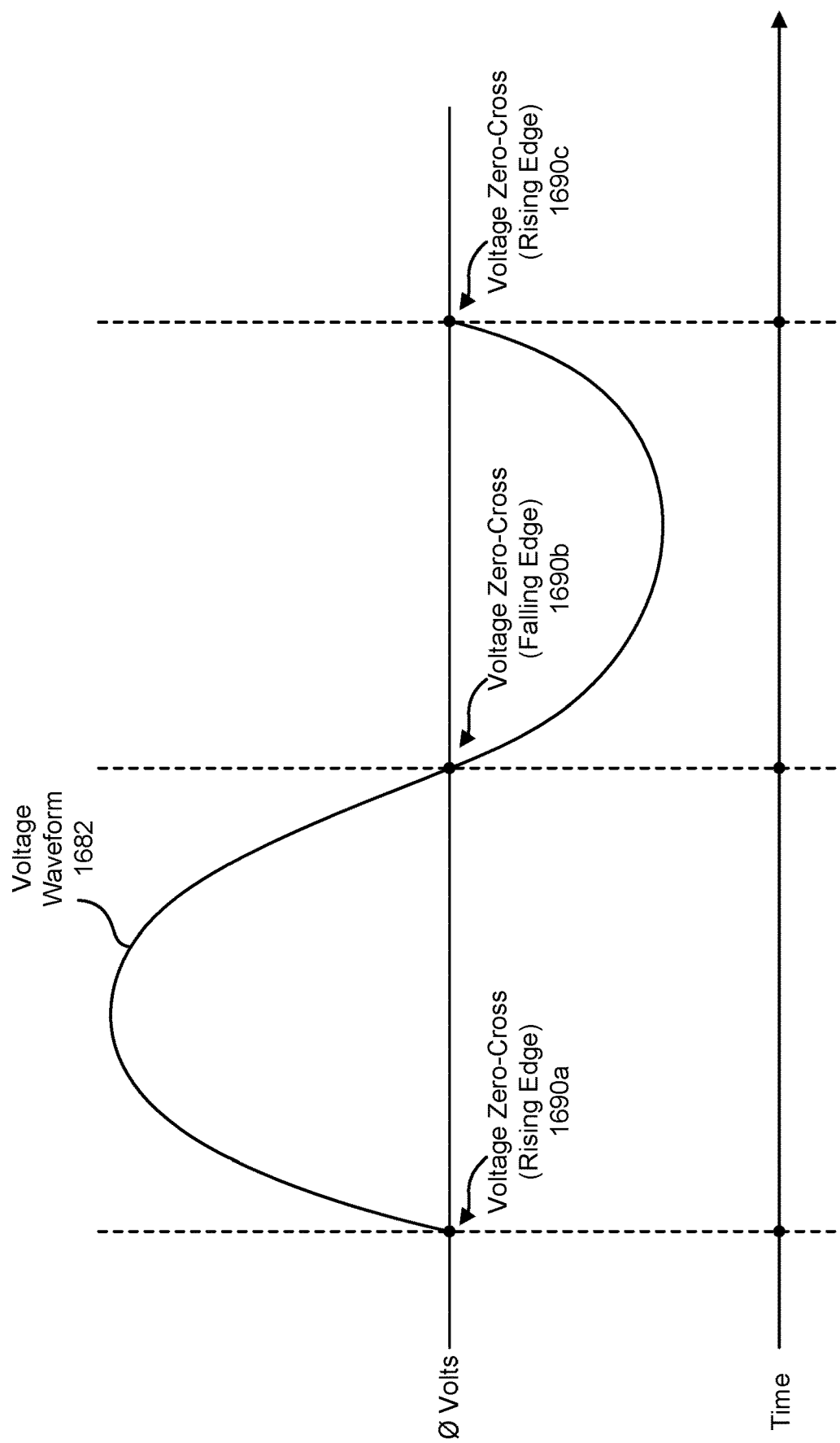
FIG. 16 illustrates multiple examples of voltage zero crossings associated with a voltage waveform.

FIG. 16 illustrates multiple examples of voltage zero crossings 1690 associated with a voltage waveform 1682. The voltage waveform 1682 may correspond to an alternating current (AC) signal. As the polarity of the AC signal alternates between positive and negative over an AC cycle, the voltage waveform 1682 will cross a zero-point where the value of the voltage is zero. The time corresponding to the point when the value of the voltage is zero is the voltage zero cross 1690. If the voltage is increasing when the voltage waveform 1682 crosses the zero point, the voltage zero cross 1690 is a rising edge voltage zero cross 1690a, c. If the voltage is decreasing when the voltage waveform 1682 crosses the zero-point, the voltage zero cross 1690 is a falling edge voltage zero cross 1690b.

The voltage waveform 1682 may be captured by sampling the continuous AC signal to produce a discrete (e.g., digital) signal as described above in relation to FIG. 14. The sampled voltage waveform 1682 may be stored in memory. The electronic device 102 may obtain the voltage zero cross 1690 based on the sampled voltage waveform 1682. For example, the electronic device 102 may determine when the value of the voltage changes sign (e.g., from positive to negative). The time associated with the voltage sample following the change in voltage sign may be the voltage zero cross 1690. Additionally or alternatively, the electronic device (e.g., electronic device 102, electronic device 1002) may include a simple AC circuit that produces a pulse each time the voltage waveform 1682 crosses zero volts in some configurations.

Figure 17:
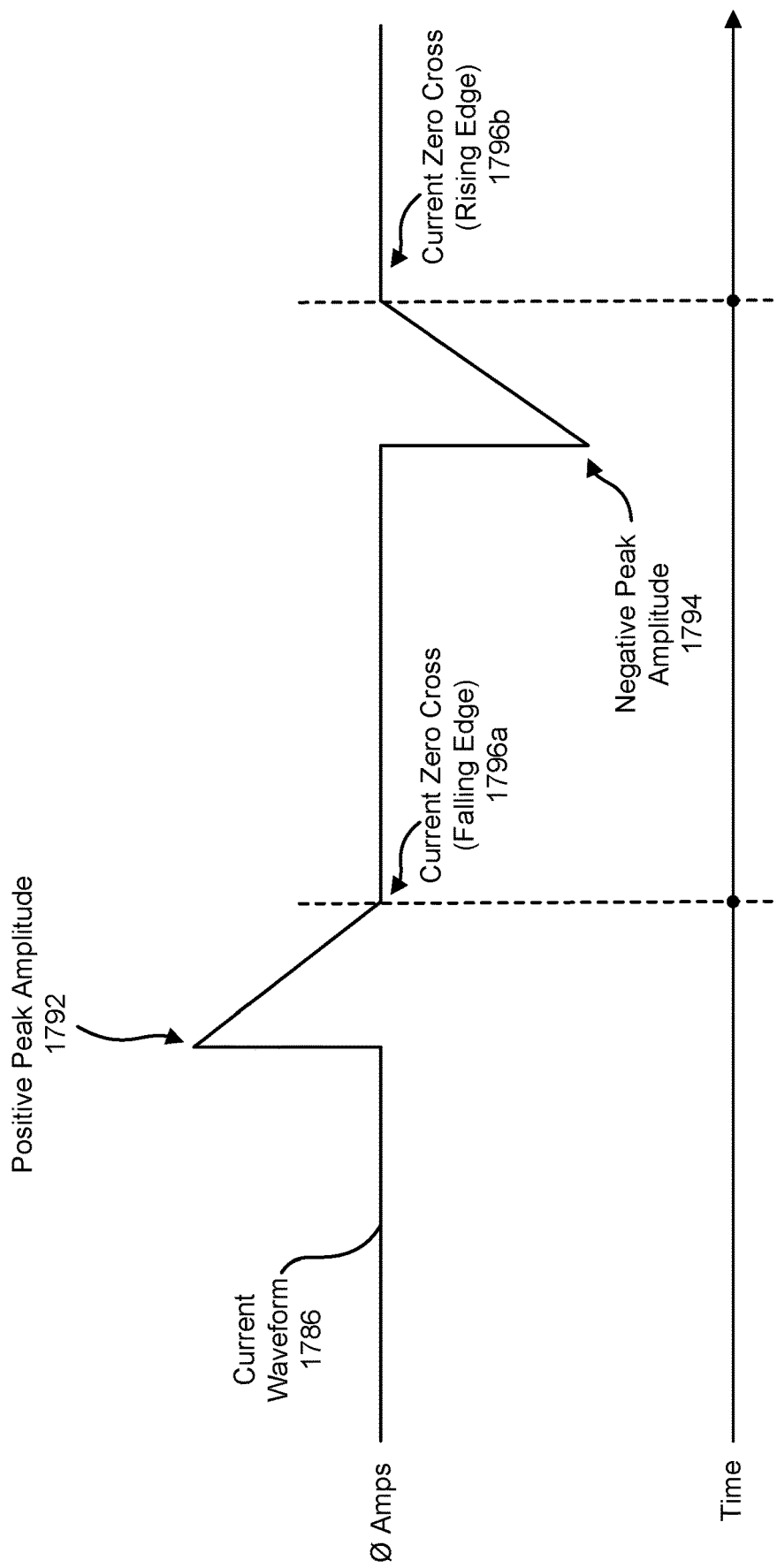
FIG. 17 illustrates multiple examples of current zero crossings associated with a current waveform.

FIG. 17 illustrates multiple examples of current zero crossings 1796 associated with a current waveform 1786. The current waveform 1786 may correspond to an alternating current (AC) signal. As the polarity of the AC signal alternates between positive and negative over an AC cycle, the current waveform 1786 will also alternate between positive and negative values. The current zero cross 1796 occurs at the time where the current is zero following an earlier point where the current is non-zero for a measurable duration. Therefore, the current zero cross 1796 may be the first point when the amplitude of the current is zero following a peak (positive or negative) current amplitude. For example, in FIG. 17, the value of the current is initially zero and then rises to a positive peak amplitude 1792 and decreases to zero amps. In this example, the current zero cross 1796a is the first time when the current equals zero after rising to the measurable positive peak amplitude 1792. If the current is decreasing (from a positive peak amplitude 1792, for instance) when the current waveform 1786 equals zero, the current zero cross 1796 is a falling edge current zero cross 1796a. If the current is increasing (from a negative peak amplitude 1794, for instance) when the current waveform 1786 equals zero, the current zero cross 1796 is a rising edge current zero cross 1796b.

The current waveform 1786 may be captured by sampling the continuous AC signal to produce a discrete (e.g., digital) signal as described above in relation to FIG. 15. The sampled current waveform 1786 may be stored in memory. An electronic device (e.g., electronic device 102) may obtain the current zero cross 1796 based on the sampled current waveform 1786. For example, the electronic device 102 may determine when the value of the current initially changes from zero to non-zero. The electronic device may then determine when the current reaches zero again. The time associated with the current reaching zero may be the current zero cross 1796. In some configurations, the electronic device 102 may utilize an analog-to-digital converter (ADC) to capture the current waveform and determine the current zero cross 1796.

Figure 18:
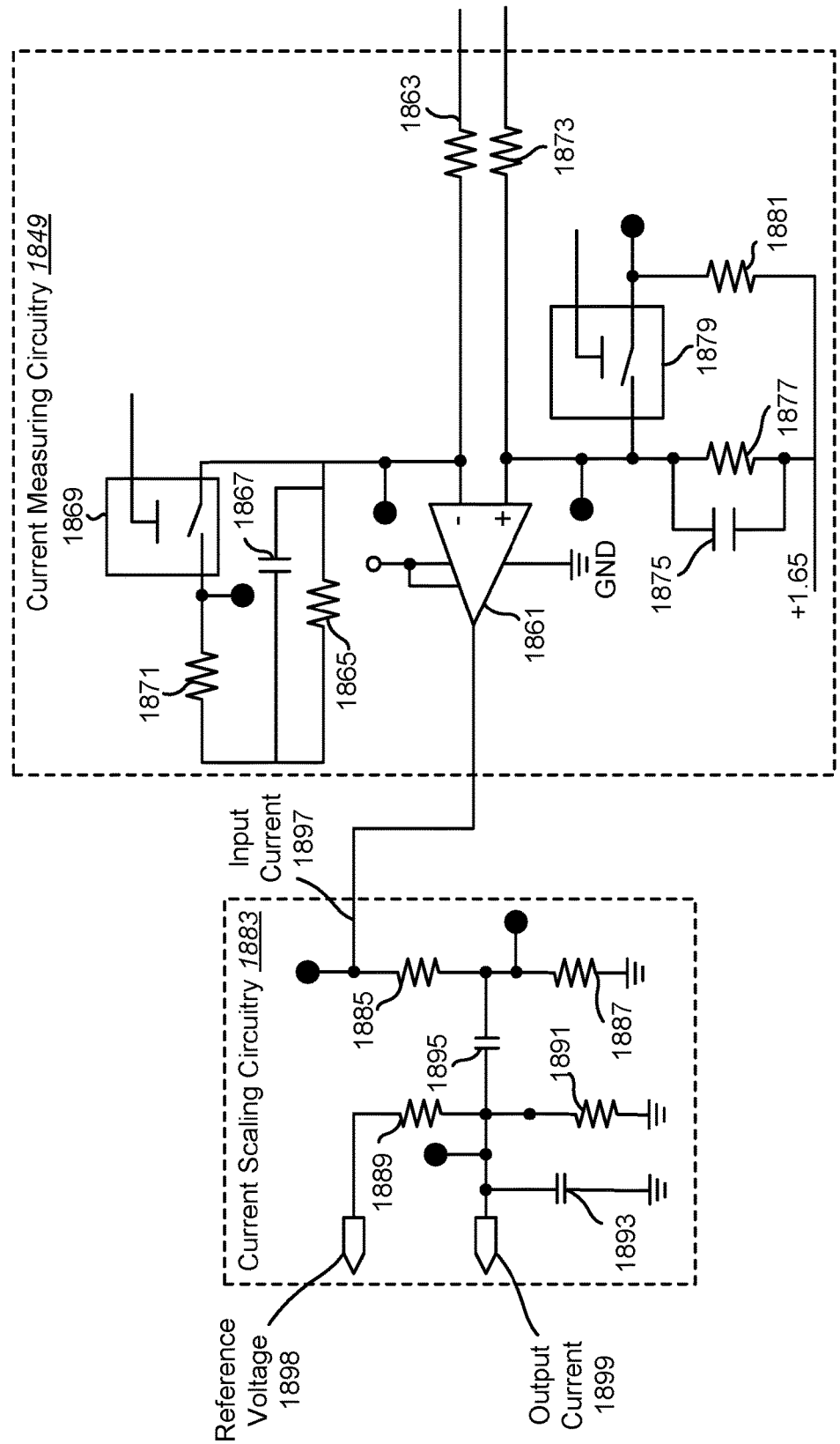
FIG. 18 is a circuit diagram illustrating one configuration of circuitry that may be implemented in one or more of the current measuring circuitries described herein.

FIG. 18 is a circuit diagram illustrating one configuration of circuitry that may be implemented in one or more of the current measuring circuitries described herein (e.g., current measuring circuitry 948, etc.). In some configurations, the current measuring circuitry 948 may include circuitry to implement a current measuring circuitry 1849.

The circuitry of FIG. 18 shows one configuration of resistors, capacitors, and other discrete components that may be implemented within the current measuring circuitry 1849. For example, the current measuring circuitry 1849 may include an amplifier 1861. The amplifier 1861 may be coupled to a supply voltage and to ground. The output of the amplifier 1861 may be coupled to other components within an electronic device (e.g., electronic device 102, electronic device 902, etc.). The negative input of the amplifier 1861 may be coupled to a first resistor 1863. The negative input of the amplifier 1861 may also be coupled to other components within the electronic device. The negative input of the amplifier 1861 may also be coupled to a second resistor 1865 and a first capacitor 1867 in parallel. The negative input of the amplifier 1861 may also be coupled to a first analog switch 1869 connected to a third resistor 1871 and other components within the electronic device. The first analog switch 1869 and the third resistor 1871 may be in parallel to the first capacitor 1867 and the second resistor 1865. The positive input of the amplifier 1861 may be coupled to a fourth resistor 1873. The positive input of the amplifier 1861 may be coupled to other components within the electronic device. The positive input of the amplifier 1861 may also be coupled to a second capacitor 1875 and a fifth resistor 1877 in parallel. The positive input of the amplifier 1861 may also be coupled to a second analog switch 1879, which is coupled to a sixth resistor 1881. The second analog switch 1879 and the sixth resistor 1881 may be in parallel to the fifth resistor 1877 and the second capacitor 1875. The second capacitor 1875, fifth resistor 1877, and sixth resistor 1881 may be coupled to a reference voltage between the supply voltage and the ground.

The current measuring circuitry 1849 may include a first analog switch 1869 and a second analog switch 1879. The analog switches 1869, 1879 may be used to control a threshold value of current flowing through the electronic device. For example, a specific load 122 may have an inrush current and settling time specifications that indicate different levels of current that may safely flow through the electronic device at a given time of operation. The analog switches 1869, 1879 may be used to modify a threshold value based on an appropriate amount of current that should be allowed to pass through the electronic device. The analog switches 1869, 1879 may be adjusted multiple times during operation of a load to adjust for current variations.

In some configurations, the current measuring circuitry may also include circuitry to implement current scaling circuitry 1883. The current scaling circuitry 1883 may be implemented in some configurations of the current measuring circuitry described herein. For example, the current scaling circuitry 1883 may interface between current measuring circuitry 1849 and a processor (e.g., microprocessor). The current scaling circuitry 1883 may include a network of resistors for scaling a current. The network of resistors may include a first resistor 1885, second resistor 1887, third resistor 1889, and fourth resistor 1891. The first resistor 1885 may be coupled to other components within the electronic device. The first resistor 1885 may also be coupled to the second resistor 1887. The second resistor 1887 may be coupled to ground. The third resistor 1889 may be coupled to a reference voltage 1898. The third resistor 1889 may also be coupled to the fourth resistor 1891, and/or to other components within the electronic device. The fourth resistor 1891 may be coupled in parallel to a first capacitor 1893 and a current reference. The fourth resistor 1891 and first capacitor 1893 may each be coupled to ground. Each of the first resistor 1885, second resistor 1887, third resistor 1889, and fourth resistor 1891 may be coupled together via a second capacitor 1895. The inputs of the current scaling circuitry 1883 may include an input current 1897 (from the current measuring circuitry 1849, for instance). The outputs of the current scaling circuitry 1883 may include an output current 1899 and a reference voltage 1898.

Figure 19:
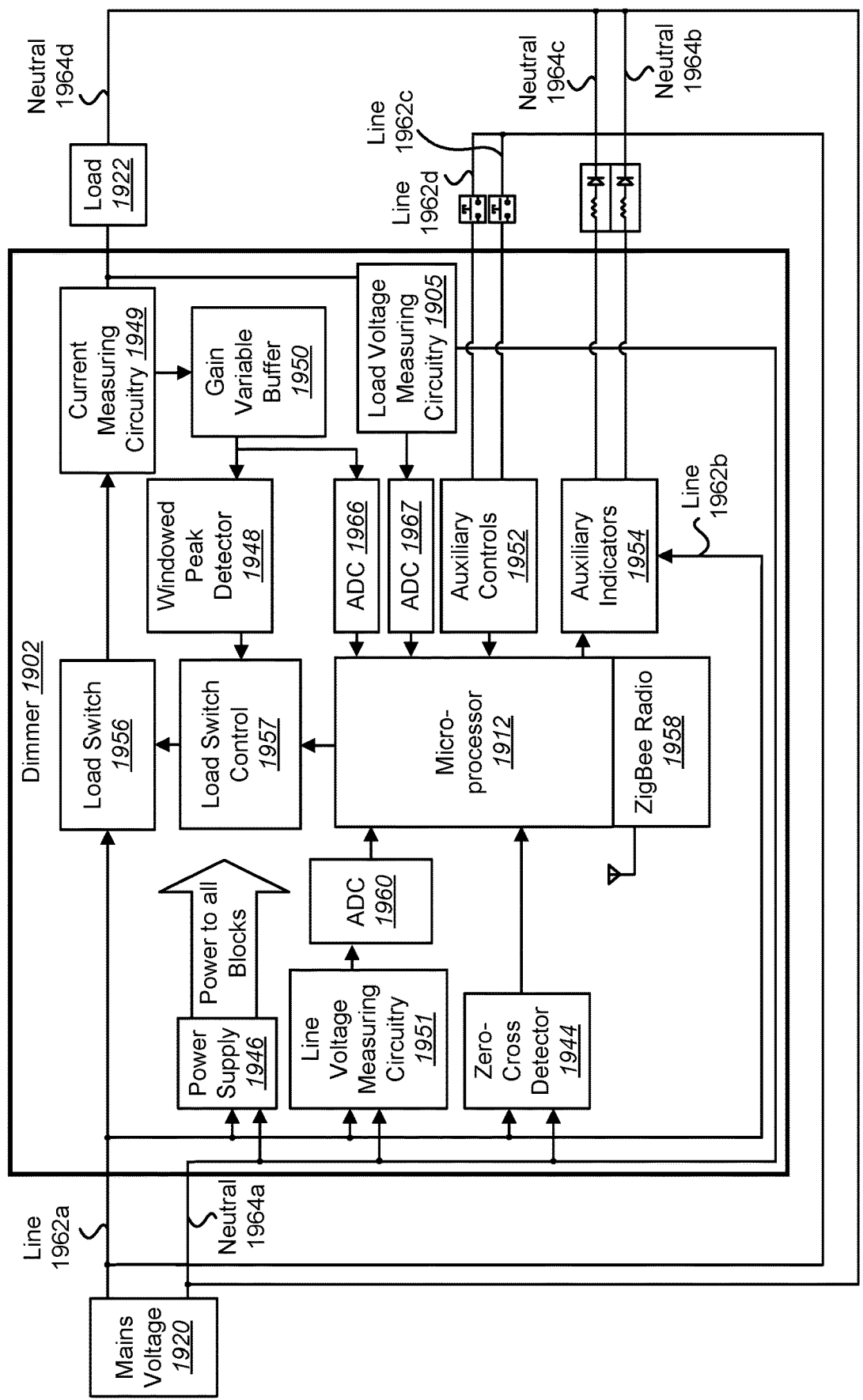
FIG. 19 is a block diagram illustrating one configuration of a dimmer in which systems and methods for controlling switching and/or systems and methods for detecting a load type may be implemented.

FIG. 19 is a block diagram illustrating one configuration of a dimmer 1902 in which systems and methods for controlling switching and/or systems and methods for detecting a load type may be implemented. The dimmer 1902 of FIG. 19 may be one example of the electronic device 102 described above in connection with FIG. 1. In some configurations, one or more of the elements described in connection with FIG. 19 may be configured with similar functionality to corresponding elements described herein.

The dimmer 1902 may receive a voltage waveform from a mains voltage 1920. The dimmer 1902 may also include an internal power supply 1946 coupled to the mains voltage 1920 that provides power to each module/block within the dimmer 1902. The mains voltage 1920 may provide power to the dimmer 1902 via a line 1962a-d coupled to a load switch 1956, a power supply 1946, a line voltage measuring circuitry 1951, a zero-cross detector 1944, auxiliary indicators 1954, and/or auxiliary controls 1952. The mains voltage 1920 may also be coupled to the power supply 1946, the line voltage measuring circuitry 1951, the zero-cross detector 1944, the auxiliary indicators 1954, and a load 1922 via a neutral line 1964*a-d*. The neutral line 1964*a-d* may be a return line for different modules/blocks within the dimmer 1902 providing a return to a ground reference voltage.

The dimmer 1902 may include a microprocessor 1912. The microprocessor 1912 may include some or all of the components of one or more of the processors (e.g., processor 112, 912, etc.) described herein. The microprocessor 1912 may include or be coupled to a ZigBee radio 1958. The ZigBee radio 1958 may be used for communicating with other electronic devices (e.g., a control system, other devices, etc.). The line voltage measuring circuitry 1951 may be coupled to the microprocessor 1912 via an ADC 1960. Load voltage measuring circuitry 1905 may be coupled across the load 1922 (if any). The load voltage measuring circuitry 1905 may be coupled to the microprocessor 1912 via a third ADC 1967. The current measuring circuitry 1949 may be coupled to the microprocessor 1912 via a second ADC 1966. The current measuring circuitry 1949 may also be coupled to a gain variable buffer 1950. The gain variable buffer 1950 may be coupled to a windowed peak detector 1948 and the second ADC 1966. In some configurations, the ADCs 1960, 1966, 1967 are part of the microprocessor 1912. The microprocessor 1912 may also be coupled to the zero-cross detector 1944, the auxiliary controls 1952, and the auxiliary indicators 1954. The microprocessor 1912 may also be coupled to the load switch 1956 for engaging or disengaging the load 1922 via instruction from a load switch control 1957.

Figure 20:
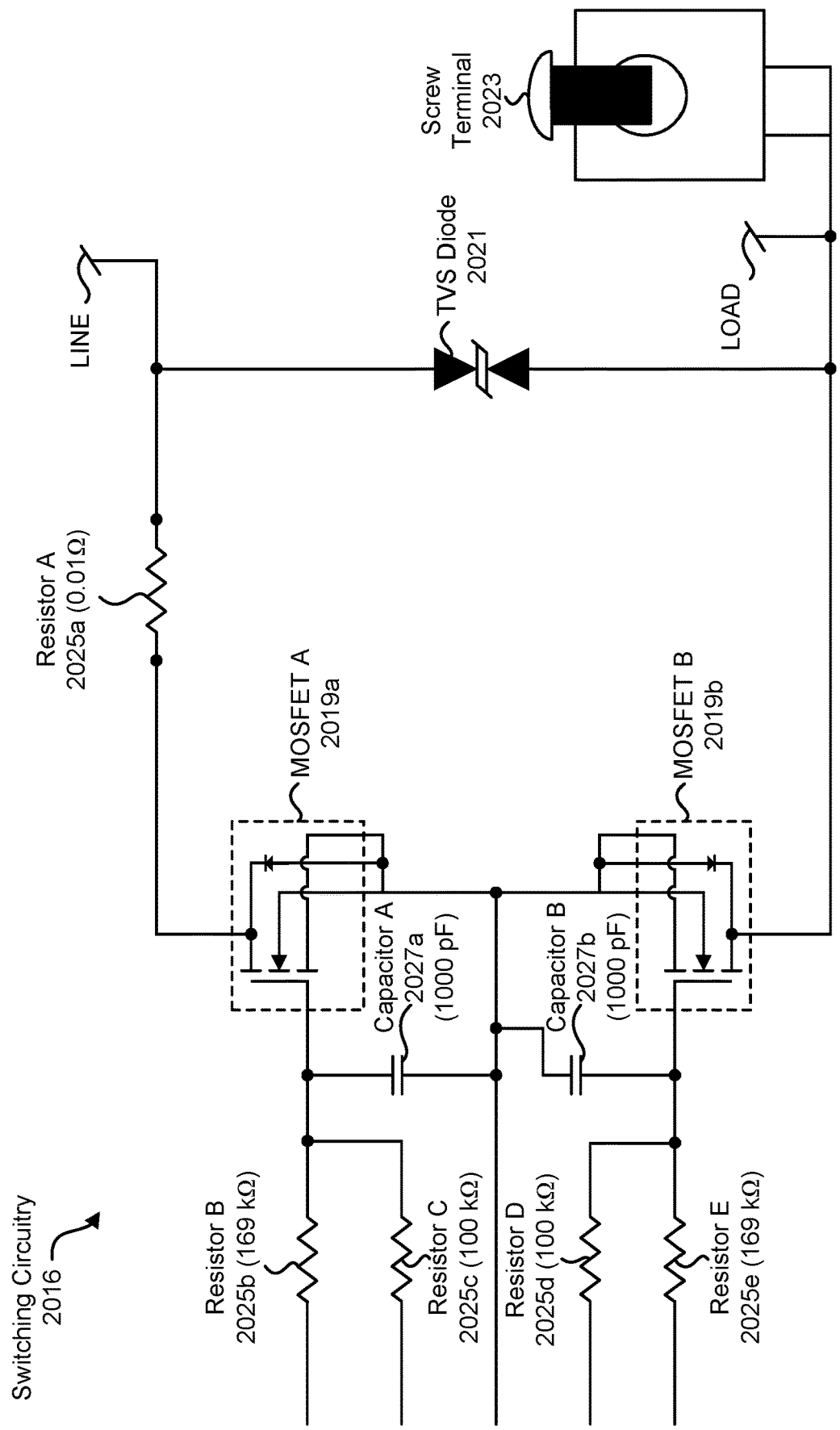
FIG. 20 is a diagram illustrating one example of switching circuitry that may be implemented in accordance with the systems and methods disclosed herein.

FIG. 20 is a diagram illustrating one example of switching circuitry 2016 that may be implemented in accordance with the systems and methods disclosed herein. The switching circuitry 2016 may be an example of one or more of the switching circuitries 116, 916 described herein. In this example, the switching circuitry 2016 includes MOSFET A 2019*a*, MOSFET B 2019*b*, resistor A 2025*a*, resistor B 2025*b*, resistor C 2025*c*, resistor D 2025*d*, resistor E 2025*e*, capacitor A 2027*a*, capacitor B 2027*b*, a transient-voltage-suppression (TVS) diode 2021, and a screw terminal 2023. It should be noted that the values for the resistors and capacitors given in FIG. 20 may be examples. Other values may be implemented. The switching circuitry 2016 may be coupled to a line (e.g., line voltage) and to a load. When an AC signal is applied to the line (e.g., 120 V, 230 V, etc.), MOSFET A 2019*a* will conduct in the positive phase and MOSFET B 2019*b* will conduct in the negative phase if the gates of the MOSFETs 2019*a-b* are enabled (Vgs is satisfied). When the gates of the MOSFETs 2019*a-b* are not enabled, the MOSFETs 2019*a-b* will not activate (e.g., turn on) and will block the positive and negative AC voltage.

Figure 21:
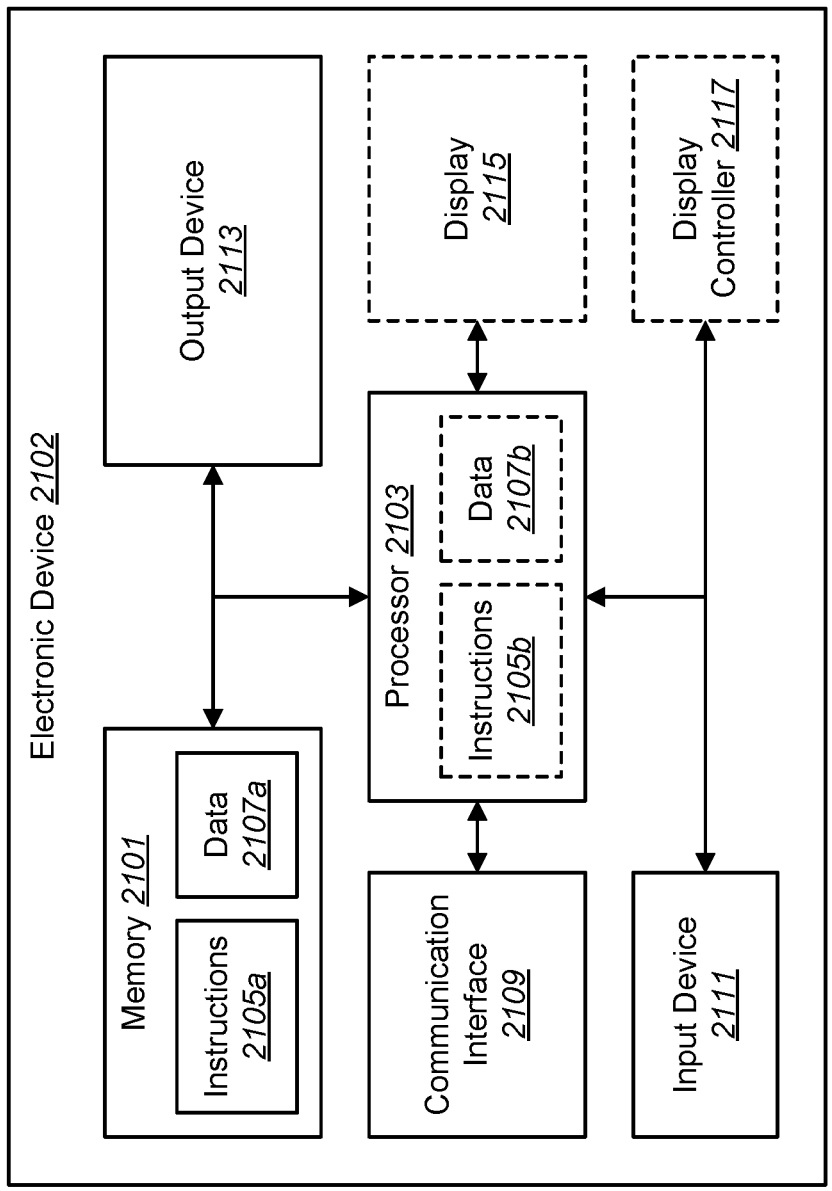
FIG. 21 illustrates various components that may be utilized in an electronic device.

FIG. 21 illustrates various components that may be utilized in an electronic device 2102. The electronic device 2102 described in connection with FIG. 21 may be configured in accordance with one or more of the electronic devices 102, 902 described herein. For example, the electronic device 2102 may be configured to perform one or more of the methods 200, 400, 700, 800, 1000 described above. The electronic device 2102 may include a memory 2101, a communication interface 2109, an input device 2111, a processor 2103, an output device 2113, a display 2115, and/or a display controller 2117. The memory 2101 may store instructions 2105*a* and data 2107*a*. The processor 2103 may operate on instructions 2105*b* and data 2107*b*. It should be noted that the display 2115 and/or display controller 2117 may be optional. For example, some configurations of the electronic device 2102 may not have a display. Additionally or alternatively, some configurations of the electronic device 2102 may include a button interface (e.g., an input device 2111). Some configurations of the electronic device 2102 may be controlled on a remote display device (e.g., a touch panel) with communication through a remote device (e.g., a controller, home automation controller, etc.).

The term "discrete circuit" refers to an electronic circuit built out of discrete components. Examples of discrete components include resistors, capacitors, inductors, transformers, transistors, etc. In some configurations, a discrete circuit may not be a solid state integrated circuit that performs all of the functions described herein. However, a discrete circuit may include one or more discrete components contained in the same packaging (e.g., bridge rectifier, solid state relay, etc.). In some configurations, a discrete circuit made from discrete components refers to a circuit having separate components or circuits that perform individual finite functions. For instance, examples of a discrete circuit may include load voltage measuring circuitry, switching circuitry, a processor, line voltage measuring circuitry, and/or current measuring circuitry that may perform separate and discrete functions while being implemented within an electronic device. An electronic device may be housed within a wall box. Moreover, each module within an electronic device may include discrete components or discrete circuits. In some instances, the term "circuit" may refer to a circuit in its entirety, for example, including the impedance of the wall box device and the impedance of the load.

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The term "computer-readable medium" refers to any available medium that can be accessed by a computer or processor. A computer-readable medium may be non-transitory and tangible. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the systems, methods, and apparatus described herein without departing from the scope of the claims.

What is claimed is:

1. An electronic device for controlling switching timing, comprising:
    switching circuitry configured to cut a load voltage cycle to produce an alternating current (AC) cyclically switched phase-cut load voltage;
    line voltage measuring circuitry configured to produce a line voltage measurement;
    load voltage measuring circuitry configured to measure the AC cyclically switched phase-cut load voltage from a load coupling to a return to produce a load voltage measurement; and
    a processor coupled to the load voltage measuring circuitry, wherein the processor is configured to determine whether a load voltage spike is indicated by the load voltage measurement based on a spike threshold stored in memory, and wherein the processor is configured to control switching timing based on whether a load voltage spike is indicated, wherein the electronic device is a dimmer, and wherein the processor is coupled, within the dimmer, (1) to the switching circuitry, (2) to the load voltage measuring circuitry, and (3) to the line voltage measuring circuitry.

2. The electronic device of claim 1, wherein, in a case that a load voltage spike is indicated, the processor is configured to control the switching timing by determining whether to adjust the switching timing to an earlier timing or a later timing based on the load voltage spike.

3. The electronic device of claim 2, wherein determining whether to adjust the switching timing to an earlier timing or a later timing comprises comparing a polarity of the load voltage spike to a previous swing polarity of the load voltage measurement.

4. The electronic device of claim 3, wherein the processor is configured to adjust the switching timing to the later timing in a case that the load voltage spike has a same polarity as the previous swing polarity, or is configured to adjust the switching timing to the earlier timing in a case that the load voltage spike has a different polarity from the previous swing polarity.

5. The electronic device of claim 1, wherein the processor is configured to control the switching timing by adjusting the switching timing in a case that a load voltage spike is indicated; and wherein the processor is configured to repeatedly adjust the switching timing until a load voltage spike is not indicated.

6. The electronic device of claim 1, wherein the processor is configured to control switching timing based on a load voltage spike caused by a dimming level change.

7. The electronic device of claim 1, wherein the processor is configured to control the switching timing based on a size of the voltage spike in a case that a voltage spike is indicated.

8. The electronic device of claim 7, wherein the processor is configured to control the switching timing by adjusting the switching timing by an amount of time relative to the size of the voltage spike.

9. The electronic device of claim 1, wherein the processor is configured to control the switching timing using a closed-loop control algorithm.

10. The electronic device of claim 1, wherein the processor is configured to detect a load type and control the switching timing when the load type is an inductive load type.

11. A method for controlling switching timing by an electronic device, comprising:
    cutting, by switching circuitry, a load voltage cycle to produce an alternating current (AC) cyclically switched phase-cut load voltage;
    measuring, by line voltage measuring circuitry, a line voltage to produce a line voltage measurement;
    measuring, by load voltage measuring circuitry, the AC cyclically switched phase-cut load voltage from a load coupling to a return to produce a load voltage measurement;
    determining, by a processor, whether a load voltage spike is indicated by the load voltage measurement based on a spike threshold stored in memory; and
    controlling, by the processor, switching timing based on whether a load voltage spike is indicated, wherein the electronic device is a dimmer, and wherein the processor is coupled, within the dimmer, (1) to the switching circuitry, (2) to the load voltage measuring circuitry, and (3) to the line voltage measuring circuitry.

12. The method of claim 11, wherein, in a case that a load voltage spike is indicated, controlling the switching timing comprises determining whether to adjust the switching timing to an earlier timing or a later timing based on the load voltage spike.

13. The method of claim 12, wherein determining whether to adjust the switching timing to an earlier timing or a later timing comprises comparing a polarity of the load voltage spike to a previous swing polarity of the load voltage measurement.

14. The method of claim 13, comprising adjusting the switching timing to the later timing in a case that the load voltage spike has a same polarity as the previous swing polarity or adjusting the switching timing to the earlier timing in a case that the load voltage spike has a different polarity from the previous swing polarity.

15. The method of claim 11, wherein controlling the switching timing comprises adjusting the switching timing in a case that a load voltage spike is indicated and repeatedly adjusting the switching timing until a load voltage spike is not indicated.

16. The method of claim 11, comprising controlling the switching timing based on a load voltage spike caused by a dimming level change.

17. The method of claim 11, comprising controlling the switching timing based on a size of the voltage spike in a case that a voltage spike is indicated.

18. The method of claim 17, wherein controlling the switching timing comprises adjusting the switching timing by an amount of time relative to the size of the voltage spike.

19. The method of claim 11, wherein controlling the switching timing is based on a closed-loop control algorithm.

20. A non-transitory computer-readable medium for controlling switching timing, the computer-readable medium comprising executable instructions for:

controlling switching circuitry to cut a load voltage cycle to produce an alternating current (AC) cyclically switched phase-cut load voltage;

receiving, from line voltage measurement circuitry, a line voltage measurement;

determining, by a processor, whether a load voltage spike is indicated by a load voltage measurement from load voltage measurement circuitry based on a spike threshold stored in memory, wherein the load voltage measurement indicates the AC cyclically switched phase-cut load voltage that is measured from a load coupling to a return; and controlling, by the processor, switching timing based on whether a load voltage spike is indicated, wherein the processor is coupled, within a dimmer, (1) to the switching circuitry, (2) to the load voltage measuring circuitry, and (3) to the line voltage measuring circuitry.

* * * * *